United States Patent
Kuo et al.

(10) Patent No.: US 12,487,523 B2
(45) Date of Patent: Dec. 2, 2025

(54) IN-SITU DEPOSITION AND DENSIFICATION TREATMENT FOR METAL-COMPRISING RESIST LAYER

(71) Applicant: Taiwan Semiconductor Manufacturing Company, Ltd., Hsin-Chu (TW)

(72) Inventors: Yi-Chen Kuo, Hsinchu (TW); Chih-Cheng Liu, Hsinchu (TW); Yen-Yu Chen, Hsinchu (TW); Jr-Hung Li, Hsinchu County (TW); Chi-Ming Yang, Hsinchu (TW); Tze-Liang Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 424 days.

(21) Appl. No.: 17/231,702

(22) Filed: Apr. 15, 2021

(65) Prior Publication Data

US 2022/0100088 A1    Mar. 31, 2022

Related U.S. Application Data

(60) Provisional application No. 63/085,610, filed on Sep. 30, 2020.

(51) Int. Cl.
  *G03F 7/004*  (2006.01)
  *G03F 7/16*  (2006.01)
  *H01L 21/027*  (2006.01)

(52) U.S. Cl.
  CPC ............ *G03F 7/0043* (2013.01); *G03F 7/168* (2013.01); *H01L 21/0274* (2013.01)

(58) Field of Classification Search
  CPC ........ G03F 7/0043; G03F 7/168; G03F 7/167; H01L 21/0274
  See application file for complete search history.

(56) References Cited

U.S. PATENT DOCUMENTS

| 8,642,488 B2 | 2/2014 | Liu et al. |
| 8,968,989 B2 | 3/2015 | Ouattara et al. |
| (Continued) | | |

FOREIGN PATENT DOCUMENTS

| JP | 04332118 A | * 11/1992 |
| TW | 200941575 A |   10/2009 |
| (Continued) | | |

OTHER PUBLICATIONS

Hongyu Chen, "Low Pressure Chemical Vapor Deposition of Tungsten as an Absorber for X-Ray Masks", http://archives.njit.edu/vol01/etd/1990s/1995/njit-etd1995-073/njit-etd1995-073.pdf (Year: 1995).*

(Continued)

*Primary Examiner* — Jonathan Johnson
*Assistant Examiner* — Alexander N. Lee
(74) *Attorney, Agent, or Firm* — HAYNES AND BOONE, LLP

(57) ABSTRACT

Metal-comprising resist layers (for example, metal oxide resist layers), methods for forming the metal-comprising resist layers, and lithography methods that implement the metal-comprising resist layers are disclosed herein that can improve lithography resolution. An exemplary method includes forming a metal oxide resist layer over a workpiece by performing deposition processes to form metal oxide resist sublayers of the metal oxide resist layer over the workpiece and performing a densification process on at least one of the metal oxide resist sublayers. Each deposition process forms a respective one of the metal oxide resist sublayers. The densification process increases a density of the at least one of the metal oxide resist sublayers. Parameters of the deposition processes and/or parameters of the densification process can be tuned to achieve different density profiles, different density characteristics, and/or dif- (Continued)

ferent absorption characteristics to optimize patterning of the metal oxide resist layer.

21 Claims, 9 Drawing Sheets

(56) References Cited

U.S. PATENT DOCUMENTS

| | | | |
|---|---|---|---|
| 9,488,913 B2 | 11/2016 | Lai et al. | |
| 2006/0029348 A1* | 2/2006 | Kempen | G02B 6/1228 |
| | | | 385/129 |
| 2006/0043536 A1 | 3/2006 | Co et al. | |
| 2008/0042283 A1 | 2/2008 | Purushothaman et al. | |
| 2010/0272988 A1* | 10/2010 | Wu | C23C 14/14 |
| | | | 428/428 |
| 2011/0195570 A1* | 8/2011 | Lin | H01L 21/76843 |
| | | | 257/E21.295 |
| 2012/0149213 A1* | 6/2012 | Nittala | H01L 21/67207 |
| | | | 257/E21.24 |
| 2016/0181507 A1* | 6/2016 | Doi | H01L 21/02282 |
| | | | 427/100 |
| 2016/0379824 A1 | 12/2016 | Wise et al. | |
| 2017/0146909 A1 | 5/2017 | Smith et al. | |
| 2017/0221704 A1 | 8/2017 | Mohanty et al. | |
| 2018/0025936 A1 | 1/2018 | Singh et al. | |
| 2018/0308690 A1 | 10/2018 | Van Schravendijk et al. | |
| 2018/0348636 A1 | 12/2018 | De Silva et al. | |
| 2020/0135451 A1 | 4/2020 | Zi et al. | |
| 2020/0219765 A1* | 7/2020 | Chen | H01L 21/76802 |
| 2022/0028691 A1* | 1/2022 | Kalutarage | G03F 7/095 |

FOREIGN PATENT DOCUMENTS

| | | |
|---|---|---|
| TW | 201905964 A | 2/2019 |
| TW | 202013602 A | 4/2020 |
| WO | WO 2019/217749 A1 | 11/2019 |

OTHER PUBLICATIONS https://www3.nd.edu/~dheemstr/equipment/cvd_firstnano/recipe_editor.pdf (Year: 2013).*
http://inside.mines.edu/~sagarwal/phgn435/SOD.htm#:~:text=Spin%20on%20glass%20(SOG)%20is,the%20procedures%20are%20the%20same). (Year: 2023).*
https://www.crmalliance.eu/silicon-metal#:~:text=Metallurgical%20grade%20silicon%20is%20known,micro%2Dprocessors%20and%20solar%20cells. (Year: 2023).*
https://www.universitywafer.com/spin-on-glass.html (Year: 2023).*
https://www.thoughtco.com/metal-profile-silicon-4019412 (Year: 2019).*

* cited by examiner

IN-SITU DEPOSITION AND DENSIFICATION TREATMENT FOR METAL-COMPRISING RESIST LAYER

The present application is a non-provisional application of and claims benefit of U.S. Patent Application Ser. No. 63/085,610, filed Sep. 30, 2020, the entire disclosure of which is incorporated herein by reference.

BACKGROUND

Lithography processes are extensively utilized in integrated circuit (IC) manufacturing, where various IC patterns are transferred to a workpiece to form an IC device. A lithography process typically involves forming a resist layer over the workpiece, exposing the resist layer to patterned radiation, and developing the exposed resist layer, thereby forming a patterned resist layer. The patterned resist layer is used as a masking element during subsequent IC processing, such as an etching process, where a resist pattern of the patterned resist layer is transferred to the workpiece. A quality of the resist pattern directly impacts a quality of the IC device. As IC technologies continually progress towards smaller technology nodes (for example, down to 14 nanometers, 10 nanometers, and below), line edge roughness (LER), line width roughness (LWR), and/or critical dimension uniformity (CDU) of the resist pattern has become critical. Multiple factors affect LER, LWR, and/or CDU of the resist pattern, among which are absorption characteristics (e.g., ability to absorb radiation) and/or outgassing characteristics (e.g., propensity to release contamination) of the resist layer. Although existing resist layers and techniques for forming the resist layers have been generally adequate for their intended purposes, they have not been entirely satisfactory in all respects and improvements are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
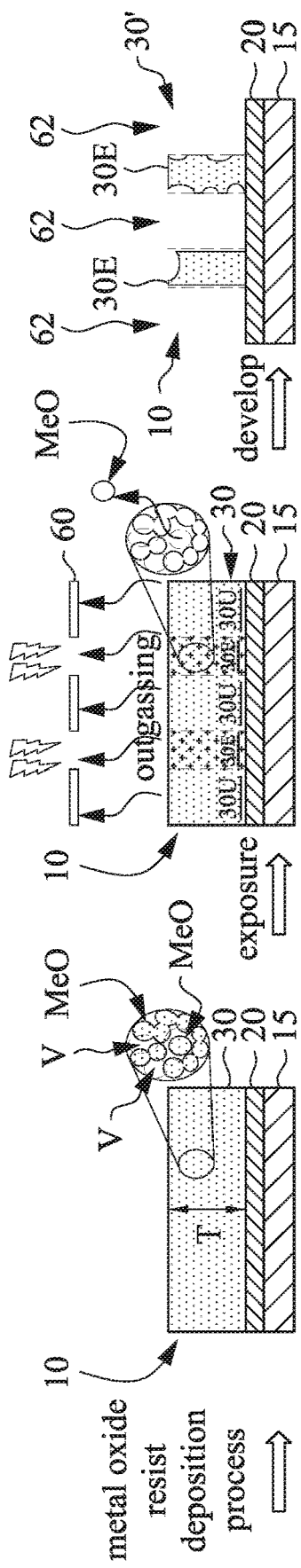
FIG. 1A illustrates lithography processes that use metal oxide resist layers to improve lithography pattern fidelity according to various aspects of the present disclosure.
Figure 1A:
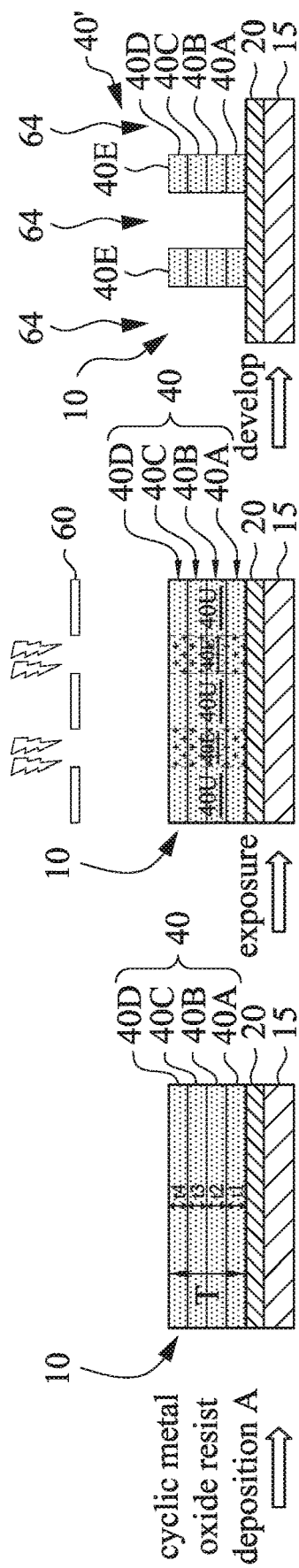

The present disclosure relates generally to methods for manufacturing integrated circuit (IC) devices, and more particularly, to lithography techniques and/or lithography materials implemented during manufacturing of IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "substantially," "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Lithography processes are extensively utilized in IC manufacturing, where various IC patterns are transferred to a workpiece to form an IC device. A lithography process involves forming a resist layer over a workpiece and exposing the resist layer to patterned radiation. After exposed to the patterned radiation, the resist layer is developed in a developer (in other words, a chemical solution). The developer removes portions of the resist layer (for example, exposed portions of positive tone resist layers or unexposed portions of negative tone resist layers), thereby forming a patterned resist layer. The patterned resist layer is then often used as a masking element during a subsequent process, such as an etching process or an implantation process, to transfer a pattern in the patterned resist layer (referred to herein as a resist pattern) to the workpiece. Advanced lithography processes, such as chemically amplified resist (CAR) materials, have been introduced to improve sensitivity (S) of the resist layer to the radiation, thereby maximizing utilization of the radiation. Sensitivity generally corresponds with an amount of incident radiation (amount of energy per unit area) required to produce sufficient chemical reactions to define a pattern in a resist layer. For example, CAR materials can generate multiple chemical reactions upon exposure to radiation, thereby chemically amplifying a response to the radiation, which reduces sensitivity and thus lowers exposure doses needed to define a resist pattern. CAR materials typically include a polymer that is resistant to an IC process (e.g., an etching process), an acid generating component (e.g., a photoacid generator (PAG)), and a solvent component. The PAG generates acid upon exposure to radiation, which functions as a catalyst for causing chemical reactions that decrease (or increase) solubility of exposed portions of a resist layer. For example, acid generated from the PAG catalyzes crosslinking of the polymer, thereby reducing solubility of the exposed portions.

While CAR materials are configured to reduce sensitivity, CAR materials must also satisfy other resist performance characteristics, such as resolution (R), resist contrast, and roughness. Resolution generally describes an ability of a resist material to print (image) a minimum feature size with acceptable quality and/or control, where resist contrast, resist thickness loss, proximity effects, swelling and/or contraction of the resist material (typically caused by development), and/or other resist characteristics and/or lithography characteristics contribute to the resolution. Resist contrast generally refers to an ability of a resist material to distinguish between light (exposed) regions and dark (unexposed) regions, where resist materials with higher contrasts provide better resolution, resist profiles, and/or roughness. Roughness, such as line edge roughness (LER) and/or line width roughness (LWR), generally describes whether a pattern in a resist layer includes edge variations, width variations, critical dimension variations, and/or other variations. For example, LER generally describes deviations in edges of a line, whereas LWR generally describes deviations in a width of the line, such as from a critical dimension (CD) width for the line. Improving one resist performance characteristic (for example, reducing LER) often comes at the expense of degrading another resist performance characteristic (for example, increasing sensitivity), such that attempts at simultaneously minimizing resolution, LER, and sensitivity is often referred to as RLS tradeoff. Overcoming the RLS tradeoff presents challenges to meeting lithography process demands for advanced IC technology nodes, which have continually smaller feature sizes, and thus require ever-shrinking resist pattern dimensions and finer lithography resolution.

Extreme ultraviolet (EUV) lithography, which utilizes radiation having wavelengths in the EUV range, provides promise for meeting finer lithography resolution limits, particularly for sub-10 nm IC manufacturing. However, higher sensitivity CAR materials are often required at EUV wavelengths because exposure doses required for meeting resolution, contrast, and/or LER requirements, along with throughput requirements (such as wafers per hour (WPH)), are limited by conventional EUV sources. For example, since a number of photons absorbed by a volume of a resist material is proportional to wavelength and an amount of absorbed energy is proportional to exposure dose, a total absorbed energy is discretized into fewer photons as wavelength decreases. A volume of resist material thus absorbs fewer EUV photons than DUV photons when exposed to the same exposure dose, which often means that less acid will be generated by CAR materials for catalyzing reactions. Such phenomenon is generally referred to as shot noise. Though increasing EUV exposure dose can alleviate the shot noise, thereby improving resolution, contrast, and/or roughness, such is achieved by increasing EUV source power or decreasing scan speed (in other words, decreasing throughput, such as WPH). Since current EUV sources have limited ability to meet the high-power EUV source requirements for CAR materials and decreasing throughput is not a viable option for meeting next generation IC manufacturing requirements, metal oxide resist materials that exhibit sufficient sensitivity to radiation while still meeting other RLS characteristics, such as resolution and LER, are being explored as potential replacements for CAR materials in EUV lithography.

Metal oxide resist materials have been observed to exhibit better EUV absorption characteristics (e.g., metal oxide resist materials can absorb more EUV photons than CAR materials), better LER/LWR characteristics (e.g., metal oxide resist materials are often less susceptible to secondary electron exposure and/or acid amplification effects that cause resist blur in CAR materials), and better etching characteristics than CAR materials (e.g., metal oxide resist materials achieve greater etching selectivity when used as an etch mask compared to CAR materials). The present disclosure explores deposition techniques for further improve patterning characteristics of metal oxide resist materials. For example, the present disclosure recognizes that metal oxide resist materials formed by conventional deposition techniques have random, loose, and often, non-ordered, non-dense, and/or non-uniform atomic structures, which can diminish LER/LWR and patterning uniformity. Further, such atomic structures can lead to undesirable outgassing that can contaminate work pieces being processed using the metal oxide resist materials and/or contaminate process tools used to process (e.g., deposit, expose, develop, etc.) the metal oxide resist materials. The present disclosure thus proposes methods for forming metal oxide resist materials having atomic structures that are less random, loose, and more ordered, dense, and/or uniform than metal oxide resist materials formed using conventional deposition techniques. The disclosed methods include performing a cyclic deposition process to form metal oxide resist sublayers that combine to form a metal oxide resist layer and performing a densification process that increases a density of at least one of the metal oxide resist sublayers. The deposition process and the densification process can be performed in a same process chamber (i.e., in-situ). Parameters of the deposition process and/or the densification process are tuned to achieve uniform densities or different densities in the metal oxide resist sublayers, thereby providing different density profiles. In some embodiments, a densification process is performed before the deposition process, for example, to enhance adhesion of the metal oxide resist layer to a workpiece. Metal oxide resist layers formed as described by the present disclosure can reduce outgassing, improve LER/LWR, and/or improve pattern uniformity across a wafer. Different embodiments disclosed herein offer different advantages and no particular advantage is necessarily required in all embodiments.

Figure 1B:
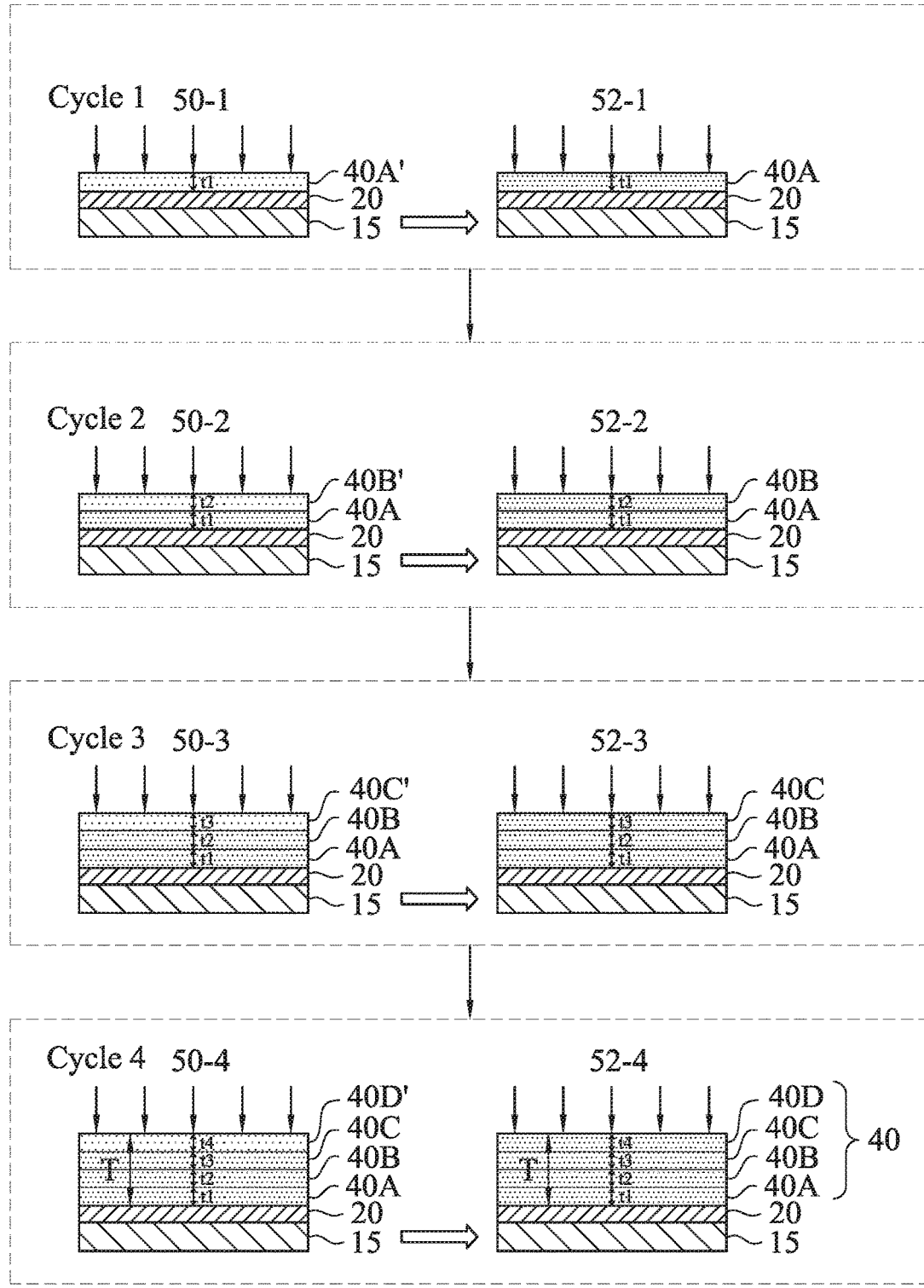
FIG. 1B illustrates a cyclic metal resist deposition process for forming the metal oxide resist layers of FIG. 1A according to various aspects of the present disclosure.
Figure 1C:
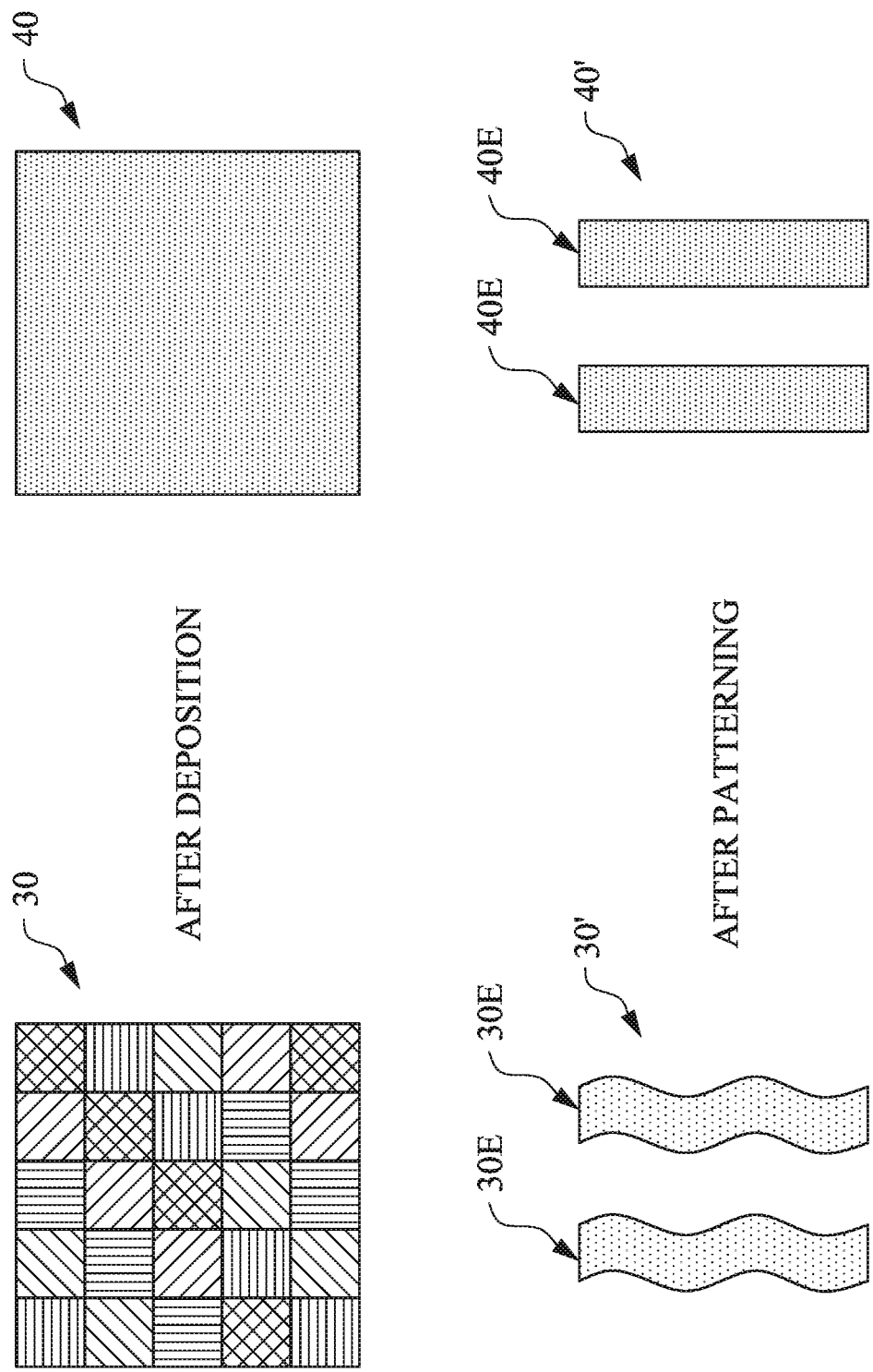
FIG. 1C illustrates top views of the metal oxide resist layers of FIG. 1A after deposition and after patterning according to various aspects of the present disclosure.

Turning to FIGS. 1A-1C, FIG. 1A illustrates lithography processes, such as a lithography process A and a lithography process B, that use metal oxide resist layers to improve lithography pattern fidelity according to various aspects of the present disclosure, FIG. 1B illustrates a cyclic metal resist deposition process A used to form the metal oxide resist layer in lithography process B according to various aspects of the present disclosure, and FIG. 1C illustrates top views of workpieces after deposition and after patterning of the metal oxide resist layers used in lithography process A and lithography process B according to various aspects of the present disclosure. In FIGS. 1A-1C, a workpiece 10, in portion or entirety, is depicted at an intermediate stage of fabrication of an IC device, where workpiece 10 undergoes lithography process A or lithography process B. In some embodiments, the IC device is a microprocessor, a memory, and/or other IC device, or portion thereof. Workpiece 10 can be a portion of an IC chip, a system on chip (SoC), or portion thereof, that includes various passive and active microelectronic devices, such as resistors, capacitors, inductors, diodes, p-type field effect transistors, n-type field effect transistors, metal-oxide semiconductor field effect transistors, complementary metal-oxide semiconductor transistors, bipolar junction transistors, laterally diffused metal-oxide semiconductor transistors, high voltage transistors, high frequency transistors, fin-like field effect transistors, gate-all-around transistors, other suitable IC components, or combinations thereof. FIGS. 1A-1C have been simplified for the sake of clarity to better understand the inventive concepts of the present disclosure. Additional features can be added in workpiece 10, lithography process A, lithography process B, and/or cyclic metal resist deposition process A, and some of the features described below can be replaced, modified, or eliminated in other embodiments of workpiece 10, lithography process A, lithography process B, and/or cyclic metal resist deposition process A.

In FIGS. 1A-1C, workpiece 10 includes a wafer 15 and a material layer 20 to be processed (also referred to herein as an underlying layer) disposed over wafer 15. Wafer 15 includes a substrate (for example, a semiconductor substrate), a mask (also referred to as a photomask or reticle), or any base material on which processing may be conducted to provide layers of material to form various features of an IC device. Depending on IC fabrication stage, wafer 15 includes various material layers (for example, dielectric layers, semiconductor layers, and/or metal layers) configured to form IC features (for example, n-wells, p-wells, isolation structures (for example, shallow trench isolation structures and/or deep trench isolation structures), source/drain features (including epitaxial source/drain features), metal gates and/or dummy gates, gate spacers, source/drain contacts, gate contacts, vias, metal lines, other IC features, or combinations thereof). In some embodiments, material layer 20 is a semiconductor layer including, for example, silicon, germanium, silicon germanium, other suitable semiconductor constituent, or combinations thereof. In some embodiments, material layer 20 is a metal layer including, for example, titanium, aluminum, tungsten, tantalum, copper, cobalt, ruthenium, alloys thereof, other suitable metal constituent and/or alloys thereof, or combinations thereof. In some embodiments, material layer 20 is a dielectric layer including, for example, silicon, metal, oxygen, nitrogen, carbon, other suitable dielectric constituent, or combinations thereof. In some embodiments, material layer 20 is a hard mask layer to be patterned for use in subsequent processing of workpiece 10. In some embodiments, material layer 20 is an anti-reflective coating (ARC) layer. In some embodiments, material layer 20 is a layer to be used for forming a gate feature, such as a gate dielectric and/or a gate electrode, a source/drain feature, such as an epitaxial source/drain, and/or an interconnect feature, such as a conductive structure or a dielectric layer of a multilayer interconnect of workpiece 10. In some embodiments, where workpiece 10 is fabricated into a mask for patterning IC devices, wafer 15 is a mask substrate that includes a transparent material and/or a low thermal expansion material (e.g., glass, quartz, silicon oxide titanium, and/or other suitable material) and material layer 20 is a layer to be processed to form an IC pattern therein, such as an absorber layer (for example, material layer 20 includes chromium). The present disclosure contemplates embodiments where material layer 20 is omitted from workpiece 10 and wafer 15 is directly processed and embodiments where material layer 20 includes more than one material layer.

Both lithography process A and lithography process B begin with depositing a metal oxide resist layer having a target thickness T over material layer 20, such as a metal oxide resist layer 30 in lithography process A and a metal oxide resist layer 40 in lithography process B. Metal oxide resist layer 30 and metal oxide resist layer 40 are both sensitive to radiation used during a lithography exposure process, such as deep ultraviolet (DUV) radiation, EUV radiation, e-beam radiation, ion beam radiation, and/or other suitable radiation. In some embodiments, metal oxide resist layer 30 and metal oxide resist layer 40 are sensitive to radiation having a wavelength less than about 13.5 nm. Metal oxide resist layer 30 and metal oxide resist layer 40 each include a metal-and-oxygen comprising radiation sensitive material, where the metal is hafnium, titanium, zirconium, tantalum, tin, lanthanum, indium, antimony, other metal constituent that facilitates absorption of radiation (e.g., EUV radiation) and/or resistance to an IC process used during fabrication of workpiece 10 (e.g., etching), or combinations thereof. In some embodiments, metal oxide resist layer 30 and/or metal oxide resist layer 40 can include other resist components that facilitate absorption of radiation and/or crosslinking reactions upon exposure to radiation, such as photoacid generator (PAG) component, thermal acid generator (TAG) component, photo-decomposable base (PDB) component, other suitable resist component, or combinations thereof. In some embodiments, before depositing metal oxide resist layer 30 and/or metal oxide resist layer 40, an ARC layer is formed over material layer 20, such that metal oxide resist layer 30 and/or metal oxide resist layer 40 are deposited on the ARC layer. The ARC layer may be a nitrogen-free ARC (NFARC) layer that includes silicon oxide, silicon oxycarbide, other suitable material, or combinations thereof. In some embodiments, more than one layer (including one or more ARC layers) can be formed between material layer 20 and metal oxide resist layer 30 and/or metal oxide resist layer 40. Metal oxide resist layer 30 and/or metal oxide resist layer 40 are also referred to as metal resist layers, photosensitive metal layers, metal imaging layers, metal patterning layers, and/or radiation sensitive metal layers.

Metal oxide resist layer 30 and metal oxide resist layer 40 are formed by different deposition processes, which results in metal oxide resist layer 30 and metal oxide resist layer 40 having different characteristics that impact pattern fidelity. In lithography process A, metal oxide resist layer 30 is blanket deposited over material layer 20 by a chemical vapor deposition (CVD) process. In some embodiments, the CVD process includes loading workpiece 10 having material layer 20 disposed over wafer 15 in a process chamber, heating workpiece 10 to a desired temperature (e.g., a temperature that facilitates chemical reactions needed to form metal-and-oxygen comprising resist material over material layer 20), flowing one or more precursors and/or carriers into the process chamber, where the precursors react and/or decompose to form a metal-and-oxygen comprising resist material over material layer 20, and purging any remaining precursors (e.g., unreacted precursors), carriers, and/or byproducts from the process chamber. The metal-and-oxygen comprising resist material accumulates on material layer 20, and the CVD process is performed until the metal-and-oxygen comprising resist material accumulated over material layer 20 has target thickness T. During the CVD process, the precursors can react with one another, material layer 20, metal-and-oxygen comprising resist material accumulating on material layer 20, and/or byproducts of chemical reactions thereof to form metal oxide resist layer 30. In some embodiments, the CVD process is a plasma enhanced CVD (PECVD), remote PECVD (RPECVD) process, a metal-organic CVD (MOCVD) process, a low-pressure CVD (LPCVD) process, ultrahigh vacuum CVD (UHVCVD) process, a sub-atmospheric pressure CVD (SACVD) process, a laser-assisted CVD (LACVD) process, an aerosol-assisted CVD (AACVD) process, atomic layer CVD (AL-CVD), other suitable CVD process, or combinations thereof. In some embodiments, metal oxide resist layer 30 having thickness T is blanket deposited over material layer 20 by an atomic layer deposition (ALD) process, a physical vapor deposition (PVD) process, or other suitable deposition process.

Because chemical reactions during the CVD process are random and/or incomplete, it has been observed that metal oxide resist layer 30 may exhibit a random, loose, and often, non-ordered, non-dense, and/or non-uniform atomic structure that can diminish patterning uniformity. For example, an atomic structure of metal oxide resist layer 30 includes randomly stacked, loosely packed metal atoms, oxygen atoms, single metal oxide molecules ($Me_1O_x$, where x is a number of oxygen atoms), and/or metal oxide clusters ($Me_yO_z$, where y is a number of metal atoms and z is a number of oxygen atoms), which can collectively be referred to as metal-and-oxygen constituents MeO. Metal-and-oxygen constituents MeO may not have an ordered arrangement (e.g., a repeating pattern of metal-and-oxygen constituents MeO), which can lead to metal oxide resist layer 30 having disparate clusters of metal-and-oxygen constituents MeO and thus a non-uniform density (e.g., an amount of metal-and-oxygen constituents MeO in one portion of metal oxide resist layer 30 is different than an amount of metal-and-oxygen constituents MeO in another, similarly sized portion of metal oxide resist layer 30). Since an amount of radiation that a material can absorb depends on its density and metal oxide resist layer 30 has a non-uniform density, metal oxide layer 30 may absorb radiation non-uniformly, which diminishes LER/LWR achievable by patterning metal oxide layer 30 (e.g., patterned metal oxide layer 30 exhibits larger than desirable LER/LWR and degraded line width and/or line edge uniformity) and/or requires larger exposure doses to ensure sufficient and/or uniform absorption of radiation to improve LER/LWR. Further, the random arrangement of metal-and-oxygen constituents MeO can lead to vacancies and/or dislocations (V) forming within the atomic structure of metal oxide resist layer 30, and incomplete chemical reactions during the CVD process can lead to metal-and-oxygen constituents MeO that are not connect to (bonded with) any other metal-and-oxygen constituents MeO of metal oxide resist layer 30, such as depicted in FIG. 1A. These "loose" metal-and-oxygen constituents MeO and/or weakly bonded metal-and-oxygen constituents MeO may outgas (i.e., escape from metal oxide resist layer 30 into an ambient of the process chamber) during subsequent processing, which can contaminate workpiece 10 and/or the process chamber. Outgassed metal-and-oxygen constituents MeO may cause film defects, for example, by scratching and/or peeling metal oxide resist layer 30, material layer 20 and/or wafer 15. Further, as multiple wafers are processed to form metal oxide resist layers, such as metal oxide resist layers 30, in a process chamber, pattern fidelity worsens over time as outgas contamination accumulates in the process chamber.

To address such issues, the present disclosure proposes cyclic metal oxide resist deposition processes that provide metal oxide resist layers that are denser than and absorb radiation better than metal oxide resist layer 30, such that lower exposure doses can be implemented to pattern the metal oxide resist layers and still achieve uniform absorption of radiation to improve LER/LWR. The denser metal oxide resist layers also exhibit less outgassing than metal oxide resist layer 30. In some embodiments, atomic structures of metal oxide resist layers formed by the proposed cyclic metal oxide resist deposition processes include metal-and-oxygen constituents stacked in an ordered arrangement (e.g., a repeating pattern of metal-and-oxygen constituents). In some embodiments, atomic structures of metal oxide resist layers formed by the proposed cyclic metal oxide resist deposition processes have less vacancies and/or less incomplete metal-and-oxygen bonds (and, in some embodiments, are substantially free of vacancies and/or incomplete metal-and-oxygen bonds) compared to metal oxide resist layer 30. In some embodiments, clusters of metal-and-oxygen constituents are distributed uniformly in metal oxide resist layers formed by the proposed cyclic metal oxide resist deposition processes, such that metal oxide resist layers formed by the proposed cyclic metal oxide resist deposition processes have substantially uniform densities (e.g., amounts of metal-and-oxygen constituents in different, similarly sized portions of the metal oxide resist layers are substantially the same). In some embodiments, a concentration of metal oxide clusters, a metal concentration, an oxygen concentration, and/or a metal oxide concentration in the proposed metal oxide resist layers increases or decreases from top surfaces to bottom surfaces of the metal oxide resist layers to achieve gradient density characteristics (e.g., a density that increases or decreases from the top surfaces to the bottom surfaces of the metal oxide resist layers). In some embodiments, a concentration of metal oxide clusters, a metal concentration, an oxygen concentration, and/or a metal oxide concentration in the proposed metal oxide resist layers is different at different depths to achieve desired density characteristics, such as those described herein. In some embodiments, the proposed metal oxide resist layers can include 12-$MeO_x$ clusters, 8-$MeO_x$ clusters, 6-$MeO_x$ clusters, 4-$MeO_x$ clusters, dimer-$MeO_x$ clusters, and/or mono-$MeO_x$ clusters depending on desired density characteristics, such as those described herein.

Turning to lithography process B, a cyclic metal resist deposition process A forms metal oxide resist layer 40 having a substantially uniform density from bottom to top, such as from a bottom surface of metal oxide layer 40 (e.g., interfacing with material layer 20) to a top surface of metal oxide resist layer 40. The density of metal oxide resist layer 40 is greater than the density of metal oxide resist layer 30, such that metal oxide resist layer 40 can absorb more radiation than metal oxide resist layer 30 when exposed to the same exposure dose and absorb such radiation more uniformly than metal oxide resist layer 30. For example, cyclic metal resist deposition process A forms a metal oxide resist sublayer 40A, a metal oxide resist sublayer 40B, a metal oxide resist sublayer 40C, and a metal oxide resist sublayer 40D, which combine to form metal oxide resist layer 40 having thickness T. Metal oxide resist sublayers 40A-40D respectively have a thickness t1, a thickness t2, a thickness t3, and a thickness t4, where a sum of thickness t1, thickness t2, thickness t3, and thickness t4 is equal to target thickness T. A density of metal oxide resist sublayer 40A, a density of metal oxide resist sublayer 40B, a density of metal oxide resist sublayer 40C, and a density of metal oxide resist sublayer 40D are substantially the same. In the depicted embodiment, densities of metal oxide resist sublayers 40A-40D are all greater than the density of metal oxide resist layer 30. In the depicted embodiment, thickness t1, thickness t2, thickness t3, and thickness t4 are substantially the same. In some embodiments, thickness t1, thickness t2, thickness t3, and/or thickness t4 are different or the same depending on desired density profile and/or density characteristics.

Turning to FIG. 1B, cyclic metal resist deposition process A includes four cycles, where each cycle forms one of metal oxide resist sublayers 40A-40D and each cycle includes a deposition process and a densification process. For example, cyclic metal resist deposition process A includes a cycle 1, a cycle 2, a cycle 3, and a cycle 4 (alternatively referred to as phases 1-4). Cycle 1 includes performing a deposition process 50-1 to form a metal oxide resist sublayer 40A' having thickness t1 and a first density on material layer 20 and performing a densification process 52-1 on metal oxide resist sublayer 40A', thereby forming metal oxide resist sublayer 40A having a second density greater than the first density. Cycle 2 includes performing a deposition process 50-2 to form a metal oxide resist sublayer 40B' having thickness t2 and a third density on metal oxide resist sublayer 40A and performing a densification process 52-2 on metal oxide resist sublayer 40B', thereby forming metal oxide resist sublayer 40B having a fourth density greater than the third density. Cycle 3 includes performing a deposition process 50-3 to form a metal oxide resist sublayer 40C' having thickness t3 and a fifth density on metal oxide resist sublayer 40B and performing a densification process 52-3 on metal oxide resist sublayer 40C', thereby forming metal oxide resist sublayer 40C having a sixth density greater than the fifth density. Cycle 4 includes performing a deposition process 50-4 to form a metal oxide resist sublayer 40D' having thickness t4 and a seventh density on metal oxide resist sublayer 40C and performing a densification process 52-4 on metal oxide resist sublayer 40D', thereby forming metal oxide resist sublayer 40D having an eight density greater than the seventh density. In the depicted embodiment, the second density, the fourth density, the sixth density, and the eighth density (i.e., densities after densification processes 52-1-52-4) are substantially the same, such that metal oxide resist layer 40 has a substantially uniform density from bottom to top. In some embodiments, the first density, the third density, the fifth density, and the seventh density (i.e., densities of as-deposited metal-and-oxygen comprising resist materials) are substantially the same. In some embodiments, the first density, the third density, the fifth density, and/or the seventh density are the same as a density of metal oxide resist layer 30. In some embodiments, the first density, the third density, the fifth density, and/or the seventh density are different. In some embodiments, densification processes 52-1-52-4 may reduce thickness t1, thickness t2, thickness t3, and/or thickness t4, respectively, such that thickness t1-t4 of as-deposited metal oxide resist sublayers 40A'-40D', respectively, are greater than thicknesses t1-t4 of metal oxide resist sublayers 40A-40D, respectively.

In some embodiments, deposition processes 50-1-50-4 are CVD processes. In some embodiments, deposition processes 50-1-50-4 are ALD processes. After loading workpiece 10 having material layer 20 disposed over wafer 15 in a process chamber, each deposition processes 50-1-50-4 can include heating workpiece 10 to a desired temperature (e.g., a temperature that facilitates chemical reactions needed to form metal-and-oxygen comprising resist material over material layer 20), flowing one or more deposition precursors and/or carriers into the process chamber, where the deposition precursors react and/or decompose to form a metal-and-oxygen comprising resist material over material layer 20, and purging any remaining deposition precursors (e.g., unreacted deposition precursors), carriers, and/or byproducts from the process chamber. Each deposition processes 50-1-50-4 has at least one deposition phase and at least one purge phase. The metal-and-oxygen comprising resist material accumulates on material layer 20 during the deposition phase, and the deposition phase is performed until the metal-and-oxygen comprising resist material accumulated over material layer 20 has thickness t1, thickness t2, thickness t3, or thickness t4 depending on cycle number. During the deposition phase, the deposition precursors can react with one another, material layer 20, metal-and-oxygen comprising resist material accumulating on material layer 20, and/or byproducts of chemical reactions thereof to form metal oxide resist sublayers 40A-40D. In some embodiments, the deposition precursors include a metal-containing precursor, a reaction gas, and/or a carrier. In some embodiments, the metal-containing precursor includes $M_aR_bX_c$, where $1 \leq a \leq 2$, $b \geq 1$, and $c \geq 1$. In some embodiments, $b+c \leq 5$. In some embodiments, M is Sn, Bi, Sb, In, Te, Ti, Zr, Hf, V, Co, Mo, W, Al, Ga, Si, Ge, P, As, Y, La, Ce, or Lu. In some embodiments, R is a substituted alkyl group, a substituted alkenyl group, a substituted carboxylate group, an unsubstituted alkyl group, an unsubstituted alkenyl group, or an unsubstituted carboxylate group. In some embodiments, X is a halide group or a sulfonate group. In some embodiments, the reaction gas includes amine, water, ozone, hydrogen peroxide, other suitable reaction gas constituents, or combinations thereof. In some embodiments, the carrier gas includes argon (e.g., Ar), helium (e.g., He), nitrogen (e.g., $N_2$), other suitable carrier gas constituent, or combinations thereof. In some embodiments, a flow rate of a deposition precursor is about 10 sccm to about 1,000 sccm. In some embodiments, a flow rate of a carrier is about 100 sccm to about 10,000 sccm. In some embodiments, a power is applied to a deposition precursor to generate a plasma, such as a power of about 10 W to about 1,000 W. In some embodiments, the plasma is generated by a radio frequency (RF) power source, such that the power is RF power. In some embodiments, a duration of the deposition phase is about 3 seconds to about 3,600 seconds. In some embodiments, a pressure maintained in the process chamber during the deposition phase is about 0.1 torr to about 150 torr. In some embodiments, a temperature maintained in the process chamber during the deposition phase is about 25° C. to about 300° C. In some embodiments, the purge phase can include flowing an inert gas (e.g., an argon-containing gas, a helium-containing gas, other suitable inert gas, or combinations thereof) into the process chamber. In some embodiments, a flow rate of the inert gas is about 100 sccm to about 10,000 sccm. In some embodiments, a duration of the purge phase is about 3 seconds to about 1,000 seconds. In some embodiments, a pressure maintained in the process chamber during the purging phase is about 10 torr to about 760 torr. In some embodiments, a temperature maintained in the process chamber during the purge phase is about 25° C. to about 300° C. In some embodiments, deposition processes 50-1-50-4 are the same. In some embodiments, deposition processes 50-1-50-4 are different. In some embodiments, deposition processes 50-1-50-4 are any combination of deposition processes for achieving desired density profile and/or density characteristics of metal oxide resist layer 40.

Densification processes 52-1-52-4 include a treatment phase, which subjects workpiece 10 to a treatment that can densify (i.e., increase a density of) metal-and-oxygen comprising resist materials, and a purge phase. In some embodiments, the treatment modifies an atomic structure of metal-and-oxygen comprising resist materials, such that the atomic structure is more ordered and/or more closely packed after the treatment. For example, the treatment rearranges metal atoms and/or oxygen atoms of the metal-and-oxygen comprising resist materials, such that the metal-and-oxygen comprising resist materials have an ordered arrangement of metal atoms and/or oxygen atoms after the treatment and/or have less spacing between metal atoms and/or oxygen atoms after the treatment. In some embodiments, the treatment strengthens metal-and-oxygen bonding and/or increases uniformity of metal-and-oxygen bonding in metal-and-oxygen comprising resist materials. For example, the treatment induces chemical reactions, such that partially reacted constituents of metal-and-oxygen comprising resist materials are completely reacted after the treatment and/or unreacted constituents of metal-and-oxygen comprising resist materials in the process chamber are partially reacted or completely reacted after the treatment. In some embodiments, the treatment induces partial crosslinking in the metal-and-oxygen comprising resist materials, which can increase densities of metal-and-oxygen comprising resist materials. The purge phase removes (purges) any remaining precursors (e.g., unreacted deposition precursors, unreacted treatment precursors, "loose" reacted precursors, "loose" metal-and-oxygen constituents, and/or other "loose" reacted constituents), carriers, and/or byproducts from the process chamber, which can further reduce outgassing from metal oxide resist layer 40 and contamination of workpiece 10 and/or the process chamber arising therefrom compared to metal oxide resist layer 30. In some embodiments, the purge phase includes flowing an inert gas (e.g., an argon-containing gas, a helium-containing gas, other suitable inert gas, or combinations thereof) into the process chamber. In some embodiments, a flow rate of the inert gas is about 100 sccm to about 10,000 sccm. In some embodiments, a duration of the purge phase is about 3 seconds to about 600 seconds. In some embodiments, a pressure maintained in the process chamber during the purging phase is about 10 torr to about 760 torr. In some embodiments, a temperature maintained in the process chamber during the purge phase is about 25° C. to about 300° C.

Example treatments that can increase a density of metal-and-oxygen comprising resist materials and/or achieve modifications to the metal-and-oxygen comprising resist materials as described herein include a plasma densification process, a soft bake process, a UV radiation process, an infrared (IR) radiation process, other suitable densification process, or combinations thereof. In some embodiments, densification processes 52-1-52-4 are the same treatment types (e.g., densification processes 52-1-52-4 are all plasma densification processes). In some embodiments, densification processes 52-1-52-4 are different treatment types (e.g., densification processes 52-1, 52-4 are plasma densification processes while densification processes 52-1, 52-3 are soft bake processes). In some embodiments, densification processes 52-1-52-4 are any combination of densification treatments for achieving desired density profile and/or density characteristics of metal oxide resist layer 40.

In some embodiments, a plasma densification process includes flowing one or more densification precursors and/or carriers into the process chamber, generating a plasma from the densification precursors, and exposing a metal oxide resist sublayer to the plasma (e.g., bombarding the metal oxide resist sublayer with the plasma). In some embodiments, the densification precursors include a metal-containing precursor, a reaction gas, and/or a carrier. In some embodiments, the metal-containing precursor includes $M_a R_b X_c$, where $1 \leq a \leq 2$, $b \geq 1$, and $c \geq 1$. In some embodiments, $b+c \leq 5$. In some embodiments, M is Sn, Bi, Sb, In, Te, Ti, Zr, Hf, V, Co, Mo, W, Al, Ga, Si, Ge, P, As, Y, La, Ce, or Lu. In some embodiments, R is a substituted alkyl group, a substituted alkenyl group, a substituted carboxylate group, an unsubstituted alkyl group, an unsubstituted alkenyl group, or an unsubstituted carboxylate group. In some embodiments, X is a halide group or a sulfonate group. In some embodiments, the reaction gas includes amine, water, ozone, hydrogen peroxide, other suitable reaction gas, or combinations thereof. In some embodiments, a carrier gas includes argon (e.g., Ar), helium (e.g., He), nitrogen (e.g., $N_2$), other suitable carrier gas constituent, or combinations thereof. In some embodiments, a flow rate of a densification precursor is about 10 sccm to about 1,000 sccm. In some embodiments, a flow rate of a carrier is about 100 sccm to about 10,000 sccm. In some embodiments, a power applied to a densification precursor and/or a carrier to generate the plasma is about 10 W to about 1,000 W. In some embodiments, the power applied to the densification precursor and/or the carrier to generate the plasma is lower power, such as less than about 100 W. In some embodiments, the plasma is generated by an RF power source, such that the power is RF power. In some embodiments, the metal oxide resist sublayer is exposed to the plasma for about 3 seconds to about 3,600 seconds. In some embodiments, a pressure maintained in the process chamber during the plasma densification process is about 0.1 torr to about 150 torr. In some embodiments, a temperature maintained in the process chamber during the plasma densification process is about 25° C. to about 300° C.

In some embodiments, a soft bake process (also referred to as an annealing process and/or a thermal process) heats workpiece 10 (including the one or more metal oxide resist sublayers) for a time. The soft bake process can apply heat to a front of workpiece 10 (e.g., to a topmost metal oxide resist sublayer of workpiece 10), a bottom of workpiece 10 (e.g., to wafer 15), sides of workpiece 10, or combinations thereof. In some embodiments, the soft bake process heats workpiece 10 to a temperature of about 80° C. to about 250° C. In some embodiments, workpiece 10 is baked (annealed) for about 60 seconds to about 300 seconds. In some embodiments, a pressure maintained in the process chamber during the soft bake process is about 0.1 torr to about 150 torr. In some embodiments, workpiece 10 is baked (annealed) in an inert gas environment (including, for example, argon, helium, and/or other inert gas constituent) or a reactive gas environment (including, for example, oxygen, hydrogen, nitrogen, and/or other reactive gas constituent).

In some embodiments, a UV radiation process exposes one or more metal oxide resist sublayers of workpiece 10 to UV radiation for a time. In some embodiments, the UV radiation has a wavelength of about 10 nm to about 400 nm. In some embodiments, the metal oxide resist sublayer is exposed to UV radiation for about 60 seconds to about 3,600 seconds. In some embodiments, the UV radiation process heats workpiece 10 to a temperature of about 20° C. to about 25° C. In some embodiments, a pressure maintained in the process chamber during the UV radiation process is about $1\times10^{-5}$ torr to about $1\times10^{-4}$ torr. In some embodiments, workpiece 10 is treated with UV radiation in an inert gas environment (including, for example, argon, helium, and/or other inert gas constituent) or a reactive gas environment (including, for example, oxygen, hydrogen, nitrogen, and/or other reactive gas constituent).

In some embodiments, an infrared (IR) radiation process exposes one or more metal oxide resist sublayers of workpiece 10 to IR radiation for a time. In some embodiments, the IR radiation has a wavelength that is greater than about 300 nm. In some embodiments, the IR radiation is far infrared (FIR) radiation having a wavelength, for example, of about 50 µm to about 1,000 µm. In some embodiments, the metal oxide resist sublayer is exposed to IR radiation for about 10 seconds to about 600 seconds. In some embodiments, the IR radiation process heats workpiece 10 to a temperature of about 25° C. to about 250° C. In some embodiments, a pressure maintained in the process chamber during the IR radiation process is about 0.1 torr to about 150 torr. In some embodiments, workpiece 10 is treated with IR radiation in an inert gas environment (including, for example, argon, helium, and/or other inert gas constituent) or a reactive gas environment (including, for example, oxygen, hydrogen, nitrogen, and/or other reactive gas constituent).

In some embodiments, a pre-deposition treatment process is performed before performing deposition processes 50-1-50-4 to enhance adhesion of metal oxide resist layer 40 to material layer 20 and reduce peeling of metal oxide resist layer 40 from material layer 20. In some embodiments, the pre-deposition treatment process is combined with deposition process 50-1. For example, a deposition phase can include a pre-deposition portion and a deposition portion, where deposition parameters are adjusted during deposition process 50-1 to switch from the pre-deposition portion to the deposition portion, such as deposition precursor flow rate, power, time, and/or temperature. Deposition parameters of the pre-deposition portion can be tuned to increase chemical reactions (and thus linking and/or bonding) between deposition precursor and material layer 20 to form a seed metal-and-oxygen comprising material on material layer 20. Deposition parameters of the deposition portion can be tuned to form metal-and-oxygen comprising material having density characteristics desired for metal oxide resist sublayer 40A. In such embodiments, the seed metal-and-oxygen comprising material can form a portion of metal oxide resist sublayer 40A. In some embodiments, the pre-deposition treatment process is a plasma treatment process. The present disclosure contemplates the pre-deposition treatment process including any treatment that can be performed on workpiece 10 to increase adhesion of metal oxide resist layer 40 thereto.

Deposition processes 50-1-50-4 and densification processes 52-1-52-4 are performed in-situ. As used herein, the term "in-situ" is used to describe processes that are performed while a workpiece remains within a processing system (e.g., a CVD tool), and where for example, the processing system allows the workpiece to remain under vacuum conditions. As such, the term "in-situ" may also generally refer to processes in which the workpiece being processed is not exposed to an external ambient (e.g., external to the processing system). Subsequent processing, such as an exposure process and a development process, may be performed ex-situ (i.e., workpiece 10 is transferred out of a CVD tool and into an exposure tool and/or a development tool). In the depicted embodiment, deposition processes 50-1-50-4 and densification processes 52-1-52-4 are performed in a same process chamber of the processing system, such as one process chamber of a CVD tool. In some embodiments, deposition processes 50-1-50-4 are performed in a first process chamber of a multi-chamber processing system, densification processes 52-1-52-4 are performed in a second process chamber of the multi-chamber processing system, and workpiece 10 is not exposed to external ambient and remains under vacuum while transferred between the first process chamber and the second process chamber and within the multi-chamber IC processing system 100 to form metal oxide resist layer 40.

Returning to FIG. 1A, after depositing metal oxide resist layer 30 and metal oxide resist layer 40, lithography process A and lithography process B proceed with exposure processes, which expose metal oxide resist layer 30 and metal oxide resist layer 40 to patterned radiation. In some embodiments, the patterned radiation has a wavelength less than about 250 nm, such as DUV radiation, EUV radiation, and/or other suitable radiation. In the depicted embodiment, the patterned radiation is EUV radiation, such as radiation having a wavelength less than about 13.5 nm. In some embodiments, such as depicted, a mask 60 having an IC pattern defined therein is used to provide patterned radiation that can form an image of the IC pattern on metal oxide resist layer 30 and metal oxide resist layer 40. Mask 60 blocks, transmits, and/or reflects radiation to metal oxide resist layer 30 and metal oxide resist layer 40 depending on a mask pattern of mask 60 and/or mask type (for example, binary mask, phase shift mask, or EUV mask). The exposure process can be performed in air, liquid (immersion lithography), or vacuum (for example, when exposing workpiece 10 to EUV radiation and/or e-beam). In some embodiments, the exposure process directly modulates radiation, such as an electron beam (e-beam) or an ion beam, according to an IC pattern without using a mask, such as mask 60.

Since metal oxide resist layer 30 and metal oxide resist layer 40 are sensitive to radiation, latent patterns are formed on metal oxide resist layer 30 and metal oxide resist layer 40 by the exposure processes. Latent pattern generally refers to a pattern exposed on a resist layer, which becomes a physical resist pattern after the resist layer is subjected to a developing process. In FIG. 1A, the latent pattern of metal oxide resist layer 30 includes exposed portions 30E and unexposed portions 30U, and the latent pattern of metal oxide resist layer 40 includes exposed portions 40E and unexposed portions 40U. Exposed portions 30E, 40E physically and/or chemically change in response to the exposure process. In the depicted embodiment, the exposure process causes chemical reactions in exposed portions 30E, 40E that decrease solubility of exposed portions 30E, 40E to a developer. In some embodiments, exposed portions 30E, 40E are insoluble to the developer. In some embodiments, after the exposure processes, a post-exposure baking (PEB) process is performed on metal oxide resist layer 30 and/or metal oxide resist layer 40. The PEB process increases a temperature of metal oxide resist layer 30 and/or metal oxide resist layer 40 to about 90° C. to about 250° C. Because metal oxide resist layer 40 has a dense and uniform atomic structure while metal oxide resist layer 30 has a loose and random atomic structure (see, for example, top views of metal oxide resist layer 30 and metal oxide resist layer 40 after deposition in FIG. 1C), an exposure dose of patterned radiation projected onto metal oxide resist layer 40 can be less than an exposure dose of patterned radiation projected onto metal oxide resist layer 30. In some embodiments, the exposure dose of patterned radiation projected onto metal oxide resist layer 40 can be about 0.1 times less than the exposure dose of patterned radiation projected onto metal oxide resist layer 30. Further, in contrast to metal oxide resist layer 30, metal oxide resist layer 40 exhibits no (or minimal) outgassing during the exposure process, the PEB process, and/or other subsequent processes, thereby reducing (and, in some embodiments, preventing) film defects in workpieces caused by outgassing contamination and/or limiting (and, in some embodiments, preventing) reductions in pattern fidelity over time that arise from outgas contamination accumulating within a process chamber as workpieces are processed to form metal oxide layers.

Lithography process A and lithography process B then each proceed with performing a developing process on metal oxide resist layer 30 and metal oxide resist layer 40, thereby forming a patterned metal oxide resist layer 30' and a patterned metal oxide resist layer 40', respectively. The developing processes dissolve exposed (or non-exposed) portions of metal oxide resist layer 30 and metal oxide resist layer 40 depending on characteristics of metal oxide resist layer 30 and metal oxide resist layer 40, respectively, and characteristics of a developing solution used in the developing process. In the depicted embodiment, negative tone development (NTD) processes are performed to remove unexposed portions 30U of metal oxide resist layer 30 and unexposed portions 40U of metal oxide resist layer 40. For example, NTD developers are applied to metal oxide resist layer 30 and metal oxide resist layer 40 that dissolve unexposed portions 30U and unexposed portions 40U, leaving patterned metal oxide resist layer 30' having openings 62 defined by exposed portions 30E and patterned metal oxide resist layer 40' having openings 64 defined by exposed portions 40E (each of which includes respective remaining portions of metal oxide resist sublayers 40A-40D). After development, patterned metal oxide resist layer 30' and patterned metal oxide resist layer 40' have resist patterns that corresponds with the IC pattern of mask 60. Because metal oxide resist layer 40 has a dense and uniform structure while metal oxide resist layer 30 has a loose and random structure, metal oxide resist layer 40 absorbs patterned radiation more uniformly than metal oxide resist layer 30, and exposed portions 40E have relatively smooth edges and/or sidewalls compared to exposed portions 30E of metal oxide layer 30. Patterned metal oxide resist layer 40' thus exhibits better LER/LWR and critical dimension uniformity than patterned metal oxide resist layer 30', significantly enhancing lithography resolution. See, for example, top views of patterned metal oxide resist layer 30' and patterned metal oxide resist layer 40' in FIG. 1C.

The present disclosure further discloses using a cyclic metal resist deposition process to control density profile and/or density characteristics of a metal oxide resist layer to obtain desired performance of the metal oxide resist layer during patterning (i.e., exposure and development) and optimize particular pattern characteristics. In some embodiments, a number of cycles (i.e., a number of metal oxide sublayers), a thickness per cycle (i.e., thicknesses of the metal oxide sublayers), a density per cycle (i.e., densities of the metal oxide sublayers), and/or a cycle time can be tuned (adjusted) to achieve desired density profile, desired density characteristics, and/or desired optimized performance parameters of a metal oxide resist layer. In some embodiments, parameters of the deposition processes, such as deposition processes 50-1-50-4, are tuned to achieve desired density profile, desired density characteristics, and/or desired optimized performance parameters of metal oxide resist sublayers. Deposition parameters can include deposition precursor type, deposition precursor flow, deposition pressure, deposition temperature, deposition power, deposition time, other deposition parameter, or combinations thereof. In some embodiments, parameters of the densification processes, such as densification processes 52-1-52-3, are tuned to achieve to achieve desired density profile, desired density characteristics, and/or desired optimized performance parameters of metal oxide resist sublayers. Densification parameters can include can treatment time, treatment temperature, treatment wavelength, treatment power, treatment precursor, treatment precursor flow, other treatment parameter, or combinations thereof.

Figure 2A:
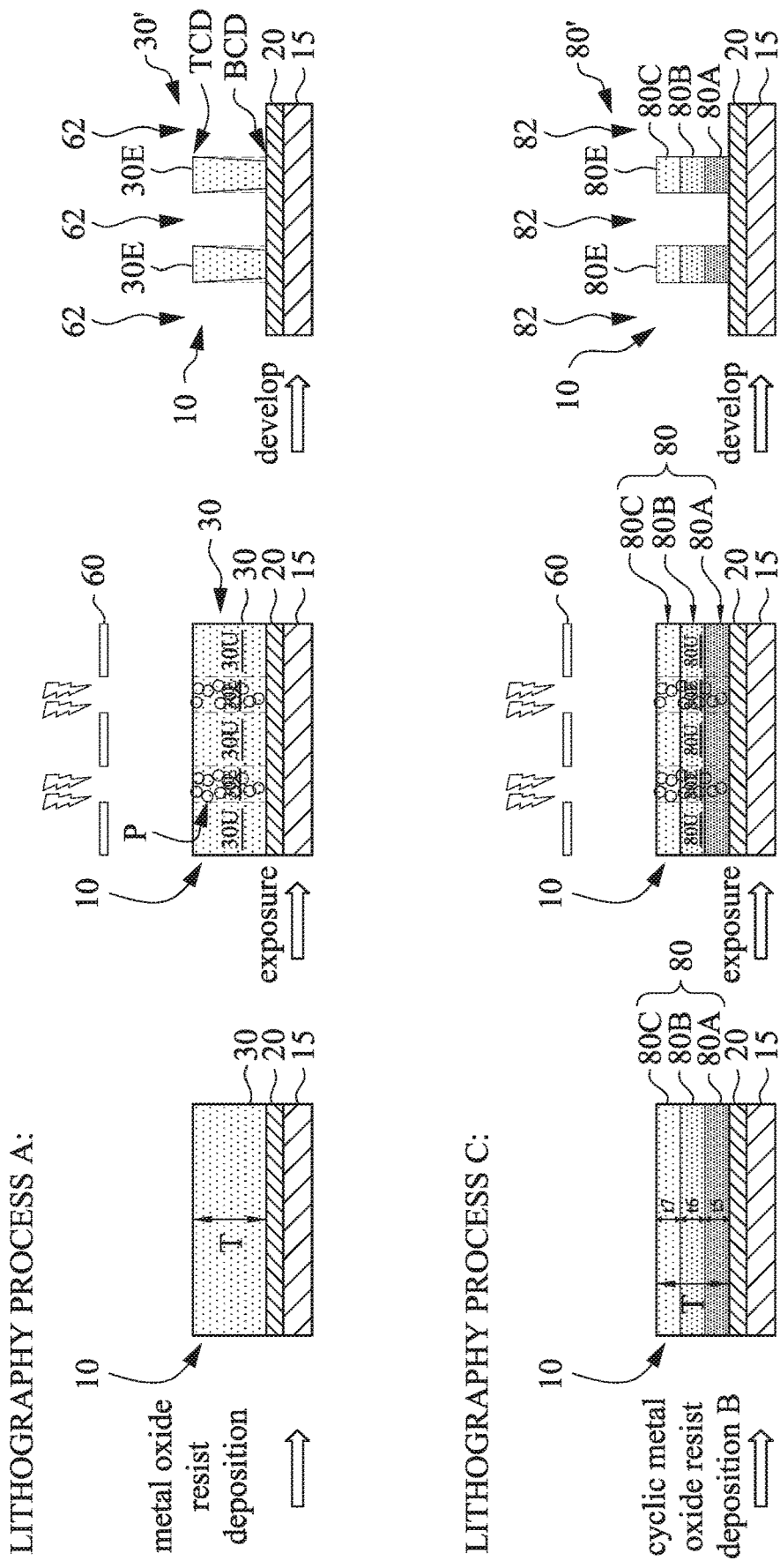
FIG. 2A illustrates different lithography processes that use metal oxide resist layers to improve lithography pattern fidelity according to various aspects of the present disclosure.

Sometimes, during an exposure process, patterned radiation cannot uniformly expose a resist layer along its depth. For example, a top of the resist layer receives a higher exposure dose than a bottom of the resist layer. Absorption of exposure photons (e.g., EUV photons) may correspondingly decrease from top to bottom of the resist layer, which reduces crosslinking in the resist layer from top to bottom of the resist layer. This phenomenon may be observed in lithography process A, as depicted in FIG. 2A, where a number of EUV photons (P) at top portions of exposed portions 30E of metal oxide resist layer 30 is more than a number of EUV photons at bottom portions of exposed portions 30E of metal oxide resist layer 30. Less chemical reactions (e.g., crosslinking) thus occur in bottom portions of exposed portions 30E compared to top portions of exposed portions 30E, and bottom portions of exposed portions 30E are partially soluble (instead of insoluble) to a developer. As a result, a resist pattern defined by exposed portions 30E exhibits biases (differences) in top critical dimensions (TCDs) and bottom critical dimensions (BCDs), thereby degrading pattern fidelity provided by patterned metal oxide resist layer 30'. In some embodiments, such as depicted, exposed portions 30E have tapered sidewalls, where widths of exposed portions 30E decrease from top to bottom and TCDs of exposed portions 30E are greater than BCDs of exposed portions 30E.

Lithography process C implements a cyclic metal resist deposition process B to provide a metal oxide resist layer 80 that accounts for such phenomenon and optimizes absorption of exposure photons (e.g., EUV photons) from top to bottom. Metal oxide resist layer 80 has a gradient density that decreases from bottom to top, such as from a bottom surface of metal oxide layer 80 (e.g., interfacing with material layer 20) to a top surface of metal oxide resist layer 80. For example, cyclic metal resist deposition process B forms a metal oxide resist sublayer 80A, a metal oxide resist sublayer 80B, and a metal oxide resist sublayer 80C, which combine to form metal oxide resist layer 80 having thickness T. In contrast to metal oxide resist layer 40 (where metal oxide resist sublayers 40A-40D have substantially the same densities), a density of metal oxide resist sublayer 80A is greater than a density of metal oxide resist sublayer 80B, and a density of metal oxide resist sublayer 80B is greater than a density of metal oxide resist sublayer 80C, such that density of metal oxide resist layer 80 decreases from bottom to top. Configuring metal oxide resist layer 80 with a low density top portion (i.e., metal oxide resist sublayer 80C) allows exposure photons to more easily pass through metal oxide resist layer 80 to a bottom portion of metal oxide layer 80 and thus increases a number of photons that reach the bottom portion of metal oxide layer 80. Configuring metal oxide resist layer 80 with a high-density bottom portion (i.e., metal oxide resist sublayer 80A) increases absorption of exposure photons by the bottom portion of the metal oxide resist layer 80. The gradient density of metal oxide resist layer 80 thus increases crosslinking in the bottom portion of the metal oxide resist layer 80. For example, during the exposure process, an amount of chemical reactions (e.g., crosslinking) in bottom portions of exposed portions 80E is substantially the same as an amount of chemical reactions in top portions of exposed portions 80E, such that exposed portions 80E become uniformly insoluble (e.g., from top to bottom) to a developer, while unexposed portions 80U remain soluble to the developer. As a result, after development, a resist pattern is provided by a patterned metal oxide resist layer 80' having openings 82 defined by exposed portions 80E having minimal (to no) bias in TCDs and BCDs (i.e., TCDs are substantially the same as BCDs), thereby improving pattern fidelity. In some embodiments, such as depicted, exposed portions 80E have substantially parallel sidewalls, and widths of exposed portions 80E are substantially the same from top to bottom. In some embodiments, the low density top portion of metal oxide resist layer 80 has a loose, random, and/or non-uniform atomic structure and the high-density bottom portion of metal oxide resist layer 80 has a dense, ordered, and/or uniform atomic structure.

In some embodiments, an overall density (e.g., average density) of metal oxide resist layer 80 is greater than an overall density (e.g., average density) of metal oxide resist layer 30, such that metal oxide resist layer 80 can absorb more radiation than metal oxide resist layer 30 when exposed to the same exposure dose and absorb such radiation more uniformly than metal oxide resist layer 30. In the depicted embodiment, the density of metal oxide resist sublayer 80A and the density of metal oxide resist sublayer 80B are greater than the density of metal oxide resist layer 30, while the density of metal oxide resist sublayer 80C is substantially the same or less than the density of metal oxide resist layer 30. In some embodiments, densities of metal oxide resist sublayers 80A-80C are all greater than the density of metal oxide resist layer 30. Metal oxide sublayers 80A-80C can have respective density profiles, such as a substantially uniform density throughout, a gradient density that increase or decreases from a bottom surface to a top surface, an alternating density, or other suitable density profile. In the depicted embodiment, each of metal oxide sublayers 80A-80C has a substantially uniform density. In some embodiments, an atomic structure of metal oxide resist sublayer 80A is more ordered and/or closely packed than an atomic structure of metal oxide resist sublayer 80B, and an atomic structure of metal oxide resist sublayer 80B is more ordered and/or closely packed than an atomic structure of metal oxide resist sublayer 80C. Metal oxide resist sublayers 80A-80C respectively have a thickness t5, a thickness t6, and a thickness t7, where a sum of thickness t5, thickness t6, and thickness t7 is equal to target thickness T. In the depicted embodiment, thickness t5, thickness t6, and thickness t7 are substantially the same. In some embodiments, thickness t5, thickness t6, and/or thickness t7 are different and/or the same depending on desired density profile and/or density characteristics desired for metal oxide resist layer 80.

Figure 2B:
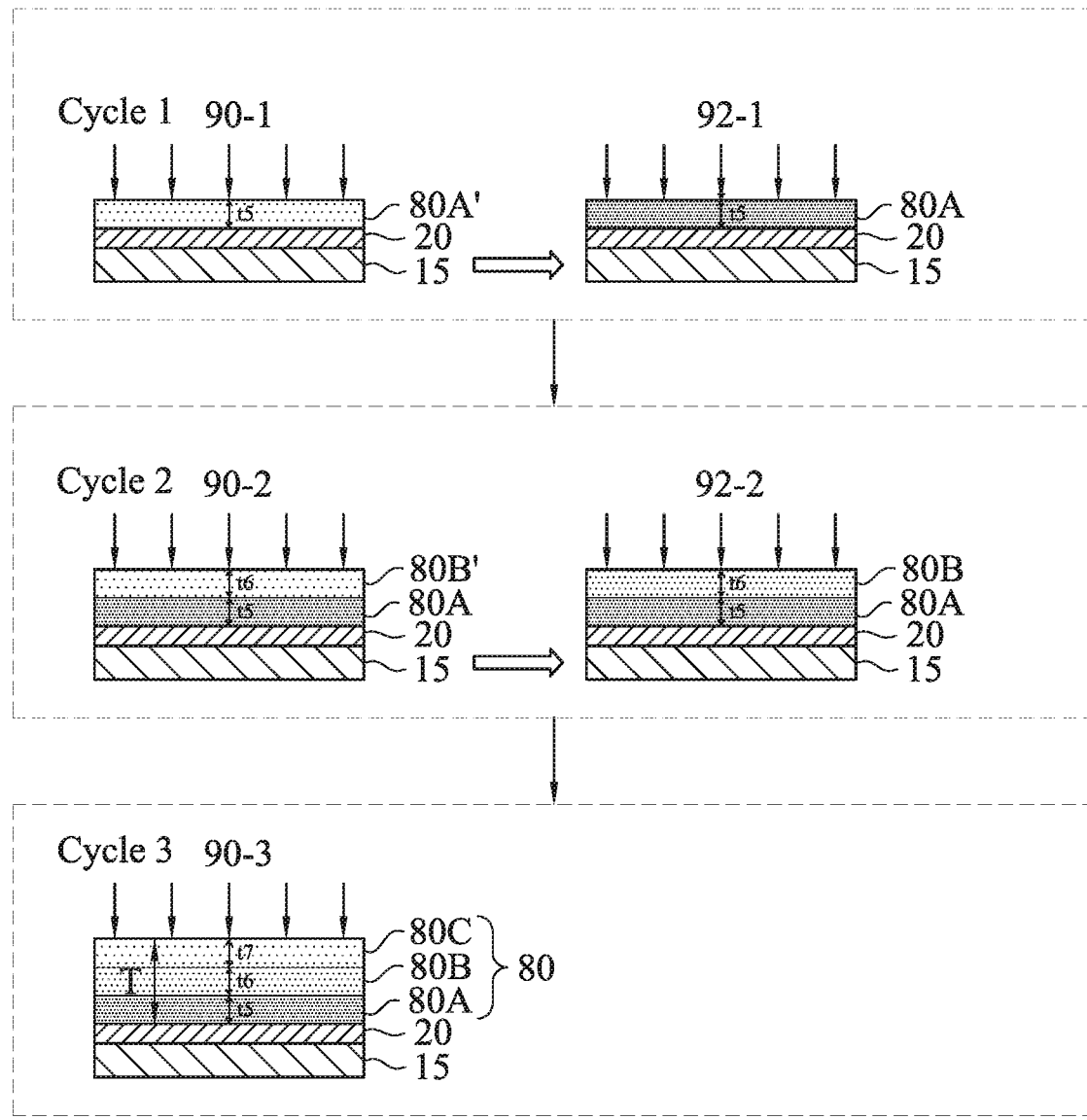
FIG. 2B illustrates a cyclic metal resist deposition process for forming the metal oxide resist layers of FIG. 2A according to various aspects of the present disclosure.

FIG. 2B illustrates cyclic metal resist deposition process B according to various aspects of the present disclosure. In FIG. 2B, cyclic metal resist deposition process B includes three cycles, where each cycle forms one of metal oxide resist sublayers 80A-80C, each cycle includes a deposition process, and some cycles include a densification process. For example, cyclic metal resist deposition process B includes a cycle 1, a cycle 2, and a cycle 3. Cycle 1 includes performing a deposition process 90-1 to form a metal oxide resist sublayer 80A' having thickness t5 and a first density on material layer 20 and performing a densification process 92-1 on metal oxide resist sublayer 80A', thereby forming metal oxide resist sublayer 80A having a second density greater than the first density. Cycle 2 includes performing a deposition process 90-2 to form a metal oxide resist sublayer 80B' having thickness t6 and a third density on metal oxide resist sublayer 80A and performing a densification process 92-2 on metal oxide resist sublayer 80B', thereby forming metal oxide resist sublayer 80B having a fourth density greater than the third density and less than the second density of metal oxide resist sublayer 80A. Cycle 3 includes performing a deposition process 90-3 to form metal oxide resist sublayer 80C having a fifth density that is less than the fourth density. No densification process is performed during cycle 3. Deposition processes 90-1-90-3 are similar to deposition processes 50-1-50-4 described above, densification processes 92-1, 92-2 are similar to densification processes 52-1-52-4, and parameters of deposition processes 90-1-90-3 and densification processes 92-1, 92-2 can be configured to achieve desired density profiles and/or desired density characteristics of metal oxide resist sublayers 80A', 80B', metal oxide resist sublayers 80A-80C, and metal oxide resist layer 80. In the depicted embodiment, the second density, the fourth density, and the fifth density (i.e., densities of the metal-and-oxygen comprising resist materials after each cycle) are different, such that metal oxide resist layer 80 has a density that increases from top to bottom. In some embodiments, the first density, the third density, and the fifth density (i.e., densities of the metal-and-oxygen comprising resist materials as-deposited) are substantially the same. In some embodiments, the first density, the third density, and/or the fifth density are different. In some embodiments, the first density, the third density, and/or the fifth density are the same as the density of metal oxide resist layer 30.

Figure 3A:
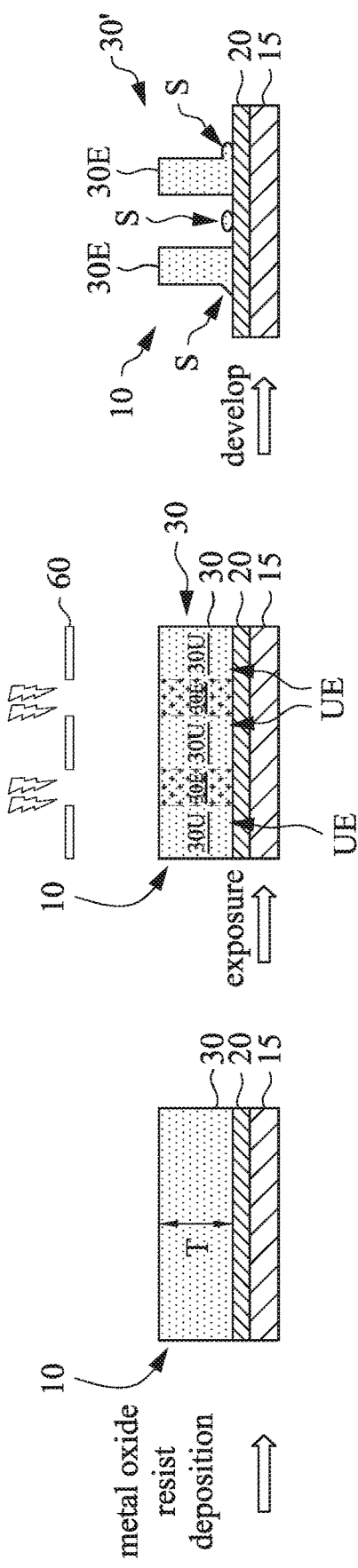
FIG. 3A illustrates different lithography processes that use metal oxide resist layers to improve lithography pattern fidelity according to various aspects of the present disclosure.
Figure 3A:
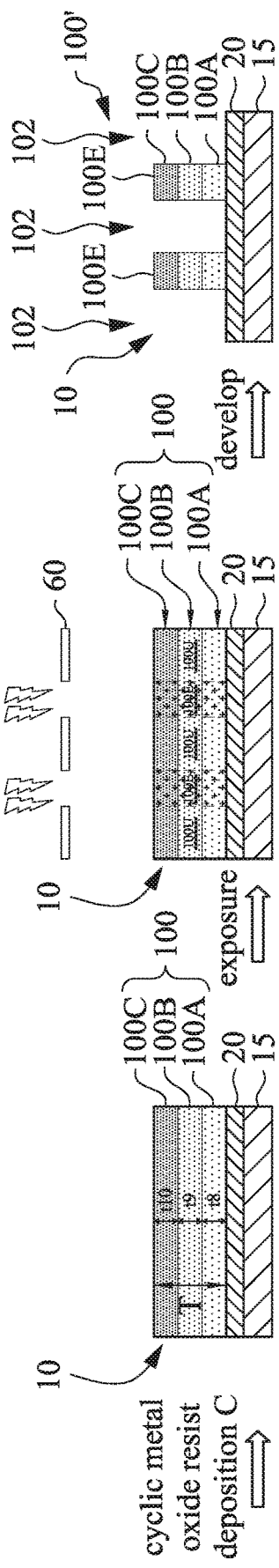

Sometimes, during an exposure process, unintentional chemical reactions (e.g., crosslinking) occur in unexposed portions of a resist layer. This phenomenon may be observed in lithography process A, as depicted in FIG. 3A, where chemical reactions undesirably and unintentionally occur in portions of metal oxide resist layer 30 covered by mask 60 (i.e., unexposed portions 30U), thereby forming unintentionally exposed portions UE that are partially insoluble (instead of soluble) to a developer. As a result, unexposed portions 30U are not completely removed by the developer, leaving resist remnants S in unexposed areas of workpiece 10. Resist remnants S correspond with unintentionally exposed portions UE, which can be resist scum (e.g., resist remnants that prevent areas of material layer 20 from being patterned) and/or resist footing (e.g., resist remnants at bottoms of exposed portions 30E, which cause critical dimension variations and/or LER/LWR variations). Lithography process D, depicted in FIG. 3A, implements a cyclic metal resist deposition process C to provide a metal oxide resist layer 100 that accounts for and minimizes such phenomenon.

Metal oxide resist layer 100 has a gradient density that increases from bottom to top, such as from a bottom surface of metal oxide layer 100 (e.g., interfacing with material layer 20) to a top surface of metal oxide resist layer 100. For example, cyclic metal resist deposition process C forms a metal oxide resist sublayer 100A, a metal oxide resist sublayer 100B, and a metal oxide resist sublayer 100C, which combine to form metal oxide resist layer 100 having thickness T. In contrast to metal oxide resist layer 40 (where metal oxide resist sublayers 40A-40D have substantially the same densities), a density of metal oxide resist sublayer 100A is less than a density of metal oxide resist sublayer 100B, and a density of metal oxide resist sublayer 100B is less than a density of metal oxide resist sublayer 100C, such that density of metal oxide resist layer 100 increases from bottom to top. Configuring metal oxide resist layer 100 with a low-density bottom portion (i.e., metal oxide resist sublayer 100A) decreases absorption of exposure photons by the bottom portion of the metal oxide resist layer 100 and thus reduces frequency of unintended chemical reactions in unexposed portions of metal oxide resist layer 100. Configuring metal oxide resist layer 100 with a high-density top portion (i.e., metal oxide resist sublayer 100B and metal oxide resist sublayer 100C) increases absorption of exposure photons by the top portion of the metal oxide resist layer 100. The gradient density of metal oxide resist layer 100 thus decreases crosslinking in the bottom portion of the metal oxide resist layer 100 while increasing crosslinking in the top portion of the metal oxide resist layer 100. For example, during the exposure process, an amount of chemical reactions (e.g., crosslinking) in bottom portions of exposed portions 100E may be less than an amount of chemical reactions in top portions of exposed portions 100E, thereby reducing a frequency of unintentional chemical reactions, such as partial crosslinking, in unexposed portions 100U adjacent to bottom portions of exposed portions 100E. As a result, after development, a resist pattern is provided by a patterned metal oxide resist layer 100' having openings 102 defined by well-defined exposed portions 100E with minimal to no resist remnants, thereby improving pattern fidelity. In some embodiments, such as depicted, exposed portions 100E have substantially parallel sidewalls, and widths of exposed portions 100E are substantially the same from top to bottom. In some embodiments, the low-density bottom portion of metal oxide resist layer 100 has a loose, random, and/or non-uniform atomic structure and the high-density top portion of metal oxide resist layer 100 has a dense, ordered, and/or uniform atomic structure.

In some embodiments, an overall density (e.g., average density) of metal oxide resist layer 100 is greater than an overall density (e.g., average density) of metal oxide resist layer 30, such that metal oxide resist layer 100 can absorb more radiation than metal oxide resist layer 30 when exposed to the same exposure dose and absorb such radiation more uniformly than metal oxide resist layer 30. In the depicted embodiment, the density of metal oxide resist sublayer 100C and the density of metal oxide resist sublayer 100B are greater than the density of metal oxide resist layer 30, while the density of metal oxide resist sublayer 100A is substantially the same or less than the density of metal oxide resist layer 30. In furtherance of the depicted embodiment, the density of metal oxide resist sublayer 100C is greater than the density of metal oxide resist sublayer 100B. In some embodiments, the density of metal oxide resist sublayer 100C and the density of metal oxide resist sublayer 100B are substantially the same. In some embodiments, densities of metal oxide resist sublayers 100A-100C are all greater than the density of metal oxide resist layer 30. Metal oxide sublayers 100A-100C can have respective density profiles, such as a substantially uniform density throughout, a gradient density that increase or decreases from a bottom surface to a top surface, an alternating density, or other suitable density profile. In the depicted embodiment, each of metal oxide sublayers 100A-100C has a substantially uniform density. In some embodiments, an atomic structure of metal oxide resist sublayer 100A is less ordered and/or closely packed than an atomic structure of metal oxide resist sublayer 100B, and an atomic structure of metal oxide resist sublayer 100B is less ordered and/or closely packed than an atomic structure of metal oxide resist sublayer 100C. Metal oxide resist sublayers 100A-100C respectively have a thickness t8, a thickness t9, and a thickness t10, where a sum of thickness t8, thickness t9, and thickness t10 is equal to target thickness T. In the depicted embodiment, thickness t8, thickness t9, and thickness t10 are substantially the same. In some embodiments, thickness t8, thickness t9, and/or thickness t10 are different and/or the same depending on desired density profile and/or density characteristics.

Figure 3B:
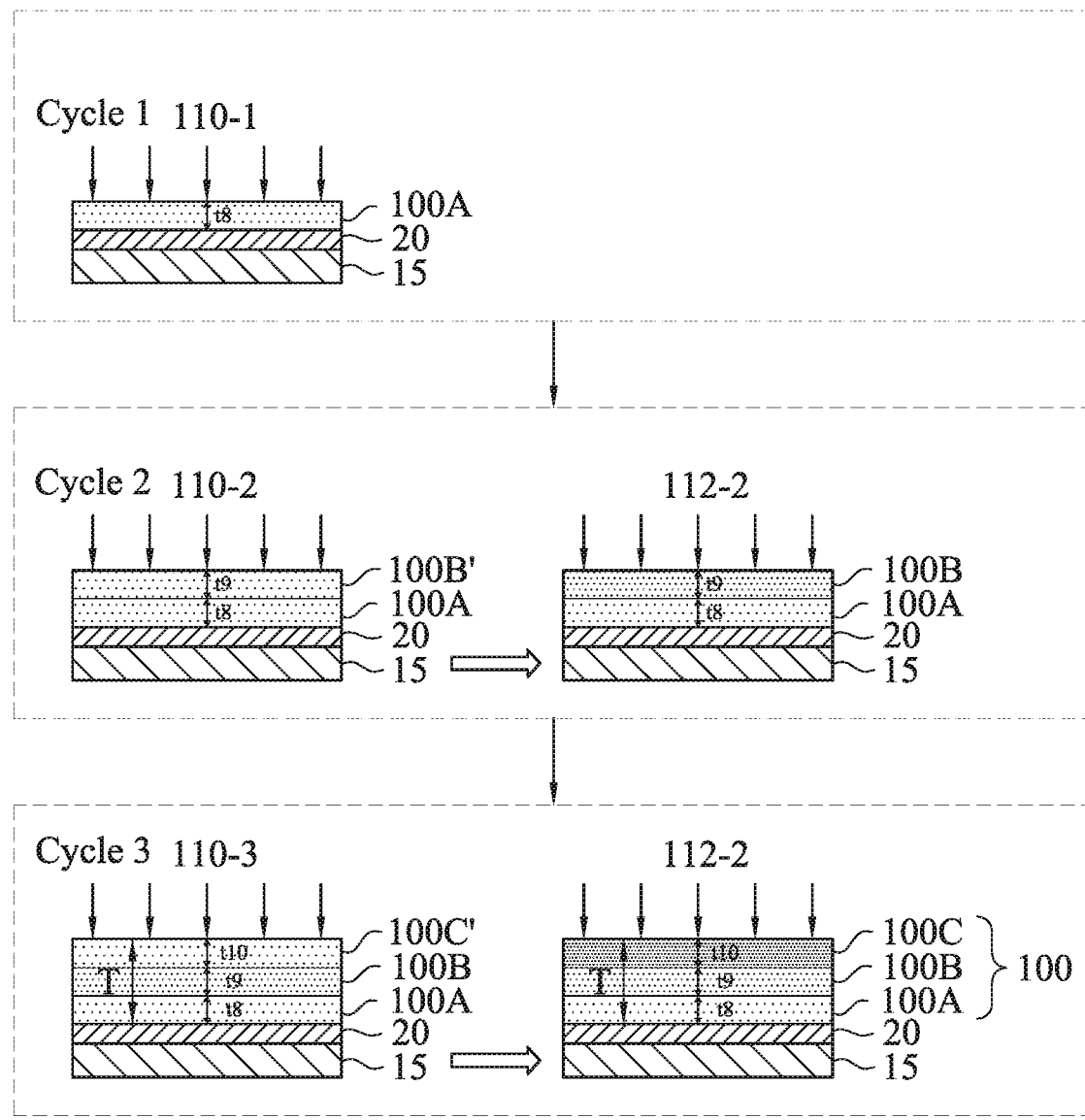
FIG. 3B illustrates a cyclic metal resist deposition process for forming the metal oxide resist layers of FIG. 3A according to various aspects of the present disclosure.

FIG. 3B illustrates cyclic metal resist deposition process C according to various aspects of the present disclosure. In FIG. 3B, cyclic metal resist deposition process C includes three cycles, where each cycle forms one of metal oxide resist sublayers 100A-100C, each cycle includes a deposition process, and some cycles include a densification process. For example, cyclic metal resist deposition process C includes a cycle 1, a cycle 2, and a cycle 3. Cycle 1 includes performing a deposition process 110-1 to form metal oxide resist sublayer 100A having thickness t8 and a first density on material layer 20. No densification process is performed during cycle 1. Cycle 2 includes performing a deposition process 110-2 to form a metal oxide resist sublayer 100B' having thickness t9 and a second density on metal oxide resist sublayer 100A and performing a densification process 112-1 on metal oxide resist sublayer 100B', thereby forming metal oxide resist sublayer 100B having a third density greater than the second density and the first density of metal oxide resist sublayer 100A. Cycle 3 includes performing a deposition process 110-3 to form metal oxide resist sublayer 100C' having thickness t10 and a fourth density and performing a densification process 112-2 on metal oxide resist sublayer 100C', thereby forming metal oxide resist sublayer 100C having a fifth density greater than the fourth density and the third density of metal oxide resist sublayer 100B. Deposition processes 110-1-110-3 are similar to deposition processes 50-1-50-4 described above, densification processes 112-1, 112-2 are similar to densification processes 52-1-52-4, and parameters of deposition processes 110-1-110-3 and densification processes 112-1, 112-2 can be configured to achieve desired density profiles and/or desired density characteristics of metal oxide resist sublayers 100B', 100C', metal oxide resist sublayers 100A-100C, and metal oxide resist layer 100. In the depicted embodiment, the first density, the third density, and the fifth density (i.e., densities of the metal-and-oxygen comprising resist materials after each cycle) are different, such that metal oxide resist layer 100 has a density that decreases from top to bottom. In some embodiments, the third density and the fifth density are the same, but different and greater than the first density. In some embodiments, the first density, the second density, and the fourth density (i.e., densities of the metal-and-oxygen comprising resist materials as-deposited) are substantially the same. In some embodiments, the first density, the second density, and/or the fourth density are different. In some embodiments, the first density, the second density, and/or the fourth density are the same as the density of metal oxide resist layer 30.

Figure 4:
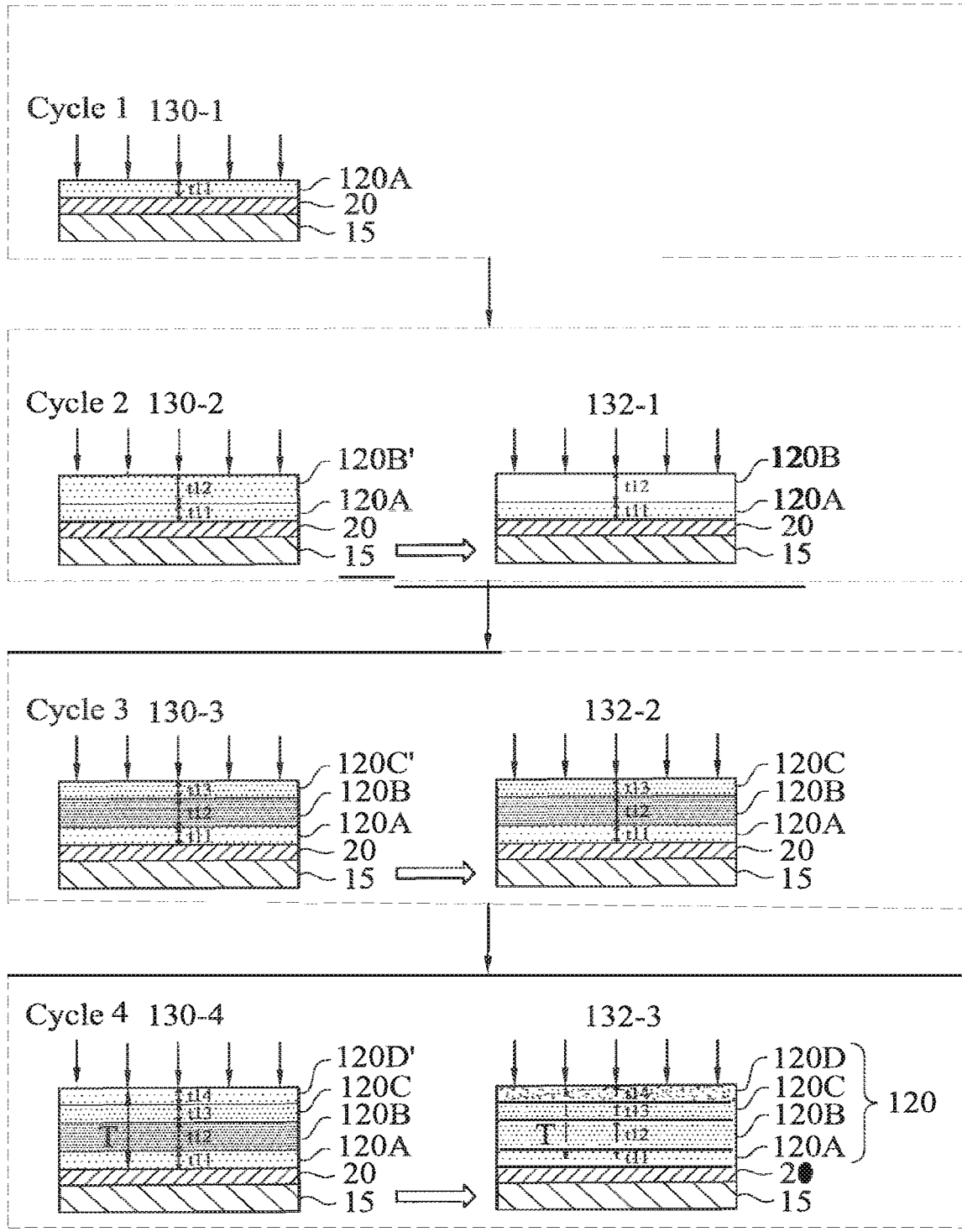
FIG. 4 illustrates a cyclic metal resist deposition process for forming a metal oxide resist layer according to various aspects of the present disclosure.

FIG. 4 illustrates a cyclic metal resist deposition process D for forming a metal oxide resist layer 120 that can be used in a lithography process to improve pattern fidelity according to various aspects of the present disclosure. Metal oxide resist layer 120 has an alternating density from bottom to top (e.g., loose-dense-loose-dense), such as from a bottom surface of metal oxide layer 120 (e.g., interfacing with material layer 20) to a top surface of metal oxide resist layer 120. For example, cyclic metal resist deposition process D forms a metal oxide resist sublayer 120A, a metal oxide resist sublayer 120B, a metal oxide resist sublayer 120C, and a metal oxide resist sublayer 120D, which combine to form metal oxide resist layer 120 having thickness T. Metal oxide resist sublayers 120A-120D respectively have a thickness t11, a thickness t12, a thickness t13, and a thickness t14, where a sum of thickness t11, thickness t12, thickness t13, and thickness t14 is equal to target thickness T. In contrast to metal oxide resist layer 40 (where metal oxide resist sublayers 40A-40D have substantially the same densities), a density of metal oxide resist sublayer 120B is greater than a density of metal oxide resist sublayer 120A, a density of metal oxide resist sublayer 120C is less than a density of metal oxide resist sublayer 120B, and a density of metal oxide resist sublayer 120D is greater than a density of metal oxide resist sublayer 120C, such that density of metal oxide resist layer 120 alternates low-high and/or an atomic structure of metal oxide resist layer 120 alternates loose-dense from bottom to top. An alternating density profile can balance various patterning concerns to optimize pattern fidelity. For example, configuring metal oxide resist layer 120 with a low-density bottom portion (i.e., metal oxide resist sublayer 120A) reduces resist scum and/or resist footing defects, while configuring metal oxide resist layer 120 with a high-density top portion (i.e., metal oxide resist sublayer 120D) minimizes outgassing and thus outgassing contamination arising from metal oxide resist layer 120. Further, configuring metal oxide resist layer 120 with a gradient density middle portion that decreases from top to bottom (i.e., metal oxide resist sublayer 120B and metal oxide resist sublayer 120C) can enhance absorption of radiation, thereby improving LER/LWR and/or critical dimension uniformity.

In some embodiments, an overall density (e.g., average density) of metal oxide resist layer 120 is greater than an overall density (e.g., average density) of metal oxide resist layer 30, such that metal oxide resist layer 120 can absorb more radiation than metal oxide resist layer 30 when exposed to the same exposure dose and absorb such radiation more uniformly than metal oxide resist layer 30. In the depicted embodiment, the densities of metal oxide resist sublayers 120B-120D are greater than the density of metal oxide resist layer 30, while the density of metal oxide resist sublayer 120A is substantially the same or less than the density of metal oxide resist layer 30. In some embodiments, the density of metal oxide resist sublayer 120D is a maximum density of metal oxide resist layer 120, the density of metal oxide resist sublayer 120A is a minimum density of metal oxide resist layer 120, and the density of metal oxide resist sublayer 120C is between the maximum density and the minimum density. In some embodiments, the density of metal oxide resist sublayer 120B is the same as the density of metal oxide resist sublayer 120D. In some embodiments, the density of metal oxide resist sublayer 120B is less than the density of metal oxide resist sublayer 120D but greater than the density of metal oxide resist sublayer 120C. In some embodiments, densities of metal oxide resist sublayers 120A-120D are all greater than the density of metal oxide resist layer 30. Metal oxide sublayers 120A-120D can have respective density profiles, such as a substantially uniform density throughout, a gradient density that increase or decreases from a bottom surface to a top surface, an alternating density, or other suitable density profile. In the depicted embodiment, each of metal oxide sublayers 120A-120D has a substantially uniform density.

In FIG. 4, cyclic metal resist deposition process D includes four cycles, where each cycle forms one of metal oxide resist sublayers 120A-120D, each cycle includes a deposition process, and some cycles include a densification process. For example, cyclic metal resist deposition process D includes a cycle 1, a cycle 2, a cycle 3, and a cycle 4. Cycle 1 includes performing a deposition process 130-1 to form metal oxide resist sublayer 120A having thickness t11 and a first density on material layer 20. No densification process is performed during cycle 1. Cycle 2 includes performing a deposition process 130-2 to form a metal oxide resist sublayer 120B' having thickness t12 and a second density on metal oxide resist sublayer 120A and performing a densification process 132-1 on metal oxide resist sublayer 120B', thereby forming metal oxide resist sublayer 120B having a third density greater than the second density and the first density of metal oxide resist sublayer 120A. Thickness t12 is greater than thickness tn. Cycle 3 includes performing a deposition process 130-3 to form metal oxide resist sublayer 120C' having thickness t13 and a fourth density and performing a densification process 132-2 on metal oxide resist sublayer 120C', thereby forming metal oxide resist sublayer 120C having a fifth density greater than the fourth density and less than the third density of metal oxide resist sublayer 120B. Thickness t13 is less than thickness t12 and greater than thickness tn. Cycle 4 includes performing a deposition process 130-4 to form metal oxide resist sublayer 120D' having thickness t14 and a sixth density and performing a densification process 132-3 on metal oxide resist sublayer 120D', thereby forming metal oxide resist sublayer 120D having a seventh density greater than the sixth density and greater than the fifth density of metal oxide resist sublayer 120C. Thickness t14 is less than thickness t13. In the depicted embodiment, the seventh density is substantially the same as the third density. Deposition processes 130-1-130-4 are similar to deposition processes 50-1-50-4 described above, densification processes 132-1-132-3 are similar to densification processes 52-1-52-4, and parameters of deposition processes 130-1-130-4 and densification processes 132-1-132-3 can be configured to achieve desired density profiles and/or desired density characteristics of metal oxide resist sublayers 120B'-120D', metal oxide resist sublayers 120A-120D, and metal oxide resist layer 120. In the depicted embodiment, the first density, the third density, the fifth density, and the seventh density (i.e., densities of the metal-and-oxygen comprising resist materials after each cycle) are different, such that metal oxide resist layer 120 has a density that varies from top to bottom. In some embodiments, the first density, the second density, the fourth density, and/or the sixth density (i.e., densities of the metal-and-oxygen comprising resist materials as-deposited) are substantially the same. In some embodiments, the first density, the second density, and/or the fourth density are different. In some embodiments, the first density, the second density, the fourth density, and/or the sixth density are the same as the density of metal oxide resist layer 30. FIG. 4 has been simplified for the sake of clarity to better understand the inventive concepts of the present disclosure. Additional features can be added in cyclic metal resist deposition process D, and some of the features described below can be replaced, modified, or eliminated in other embodiments of cyclic metal resist deposition process D.

Figure 5:
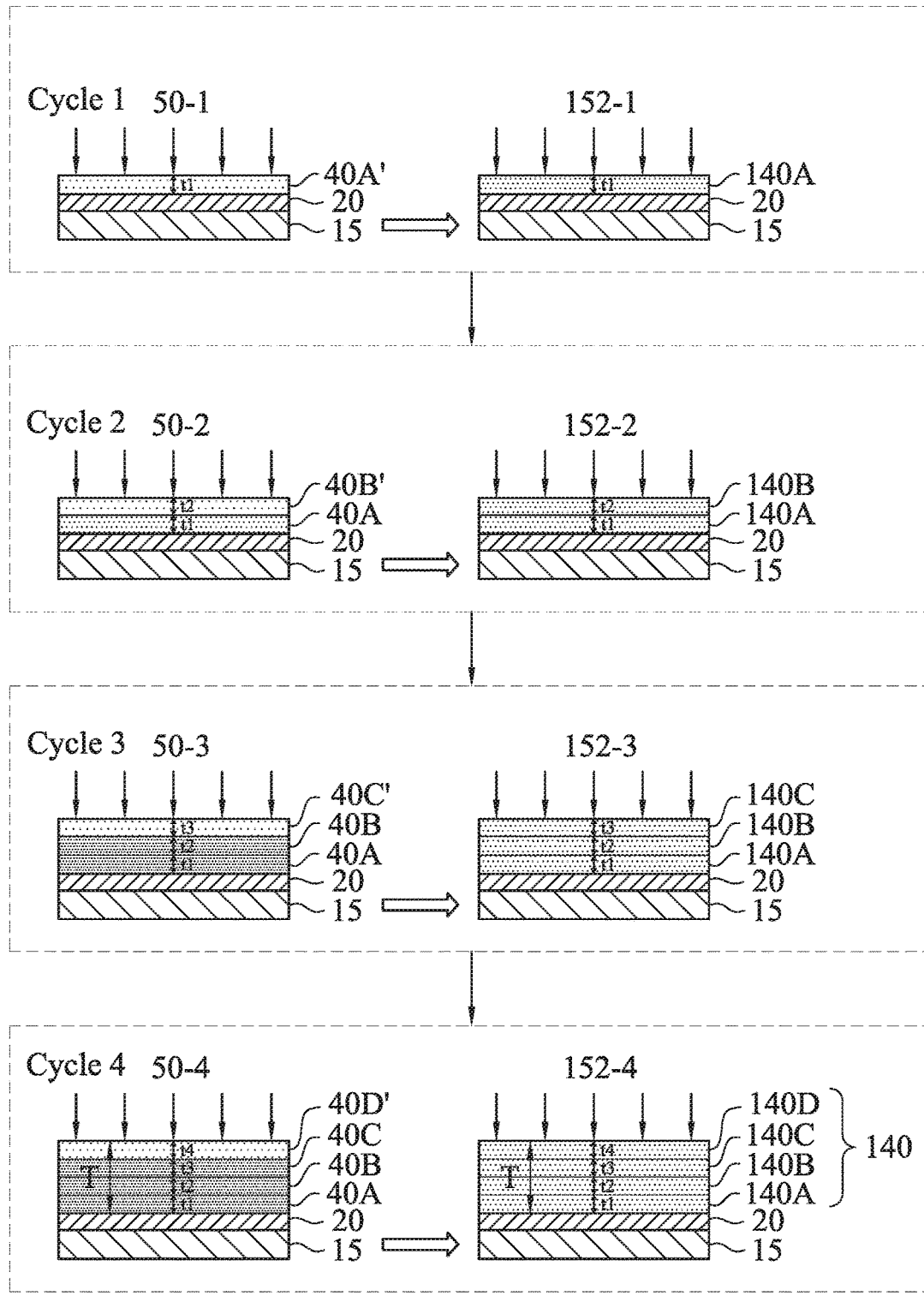
FIG. 5 illustrates a cyclic metal resist deposition process for forming a metal oxide resist layer according to various aspects of the present disclosure.

FIG. 5 illustrates a cyclic metal resist deposition process E for forming a metal oxide resist layer that can be used in a lithography process to improve pattern fidelity according to various aspects of the present disclosure. Cyclic metal resist deposition process E is similar to cyclic metal resist deposition process A, except cyclic metal resist deposition process E forms a metal oxide resist layer 140 and tunes densification processes to induce partial crosslinking in metal oxide resist layer 140. For example, metal oxide resist layer 140 is uniformly, partially crosslinked from bottom to top, such as from a bottom surface of metal oxide layer 140 (e.g., interfacing with material layer 20) to a top surface of metal oxide resist layer 140. A degree of crosslinking in metal oxide resist layer 140 is greater than a degree of crosslinking in metal oxide resist layer 30 (which may be zero), such that metal oxide resist layer 140 can be patterned with a smaller exposure dose than required for metal oxide resist layer 30. In FIG. 5, cyclic metal resist deposition process E forms a metal oxide resist sublayer 140A, a metal oxide resist sublayer 140B, a metal oxide resist sublayer 140C, and a metal oxide resist sublayer 140D, which combine to form metal oxide resist layer 140 having thickness T. Metal oxide resist sublayers 140A-140D respectively have thickness t1, thickness t2, thickness t3, and thickness t4, where a sum of thickness t1, thickness t2, thickness t3, and thickness t4 is equal to target thickness T. A degree of partial crosslinking in metal oxide resist sublayer 140A, a degree of partial crosslinking in metal oxide resist sublayer 140B, a degree of partial crosslinking in metal oxide resist sublayer 140C, and a degree of partial crosslinking in metal oxide resist sublayer 140D are substantially the same. In the depicted embodiment, thickness t1, thickness t2, thickness t3, and thickness t4 are substantially the same. In some embodiments, thickness t1, thickness t2, thickness t3, and/or thickness t4 are different or the same depending on desired partial crosslinking profile. FIG. 5 has been simplified for the sake of clarity to better understand the inventive concepts of the present disclosure. Additional features can be added in cyclic metal resist deposition process E, and some of the features described below can be replaced, modified, or eliminated in other embodiments of cyclic metal resist deposition process E.

In FIG. 5, cyclic metal resist deposition process E includes four cycles, where each cycle forms one of metal oxide resist sublayers 140A-140D and each cycle includes a deposition process and a densification process. For example, cyclic metal resist deposition process E includes a cycle 1, a cycle 2, a cycle 3, and a cycle 4, where cycles 1-4 include deposition processes 50-1-50-4 that form metal oxide resist sublayers 40A'-40D', respectively, as described above with reference to FIGS. 1A-1C. Cycle 1 includes performing a densification process 152-1 to induce crosslinking in metal oxide resist sublayer 40A', thereby providing metal oxide resist sublayer 140A having a first degree of crosslinking. Cycle 2 includes performing a densification process 152-2 to induce crosslinking in metal oxide resist sublayer 40B', thereby providing metal oxide resist sublayer 140B having a second degree of crosslinking. Cycle 3 includes performing a densification process 152-3 to induce crosslinking in metal oxide resist sublayer 40C', thereby providing metal oxide resist sublayer 140C having a third degree of crosslinking. Cycle 4 includes performing a densification process 152-4 to induce crosslinking in metal oxide resist sublayer 40D', thereby providing metal oxide resist sublayer 140D having a fourth degree of crosslinking. The first degree, the second degree, the third degree, and the fourth degree of crosslinking are less than complete crosslinking. In the depicted embodiment, the first degree, the second degree, the third degree, and the fourth degree of crosslinking are substantially the same, which can be achieved by tuning parameters of densification processes 152-1-152-4. In some embodiments, the first degree, the second degree, the third degree, and the fourth degree of crosslinking are different and/or the same to achieve metal oxide resist layer having different crosslinking profiles. In some embodiments, metal oxide resist layer 140 has a degree of crosslinking that varies from top to bottom. For example, the first degree of crosslinking is greater than the second degree, the third degree, and/or the fourth degree of crosslinking. Densification processes 152-1-152-4 are similar to densification processes described above. For example, densification processes 152-1-152-4 can be soft bakes, UV treatments, IR treatments, other suitable treatments, or combinations thereof.

After performing the various lithography processes described herein (e.g., lithography process A, lithography process B, lithography process C, and/or lithography process D), a fabrication process is performed on workpiece 10, such as material layer 20 and/or wafer 15, using the patterned metal oxide resist layers described herein (e.g., patterned metal oxide resist layer 30', patterned metal oxide resist layer 40', patterned metal oxide resist layer 80', patterned metal oxide resist layer 100', patterned metal oxide resist layer formed from metal oxide resist layer 120, and/or patterned metal oxide resist layer formed from metal oxide resist layer 140) as masks. For example, the fabrication process is applied only to portions of workpiece 10 within openings of the patterned metal oxide resist layers, while other portions of workpiece 10 covered by the patterned metal oxide resist layers (for example, by exposed portions of the patterned metal oxide resist layers) are protected from the fabrication process. In some embodiments, the fabrication process includes etching material layer 20 using the patterned metal oxide resist layers as etching masks. A pattern is thus transferred from the patterned metal oxide resist layers to material layer 20, thereby forming a patterned material layer. In embodiments where material layer 20 is a hard mask layer, the pattern is first transferred from the patterned metal oxide resist layers to material layer 20, and then the pattern is transferred from the patterned material layer 20 to a material layer of wafer 15. In some embodiments, the fabrication process includes performing an implantation process on material layer 20 using the patterned metal oxide resist layers as an implant mask, thereby forming various doped features (regions) in material layer 20. In some embodiments, the fabrication process includes depositing a material over material layer 20 using the patterned metal oxide resist layers as a deposition mask, thereby forming various material features (e.g., gates and/or contacts) over material layer 20. Thereafter, the patterned metal oxide resist layers are removed from workpiece 10 using any suitable process. In some embodiments, the patterned metal oxide resist layers may be partially consumed during the fabrication process, such as during the etching process, such that any remaining portion of the patterned metal oxide resist layers are subsequently removed by a suitable process.

The present disclosure provides metal oxide resist layers, cyclic metal oxide resist deposition processes for forming the metal oxide resist layers, and lithography techniques that implement the metal oxide resist layers to improve lithography resolution and/or resist pattern fidelity. The present disclosure contemplates that the cyclic metal oxide resist deposition processes described herein can be implemented to form any type of metal-comprising resist layer, such as a metal nitride resist layer, a metal carbide resist layer, and/or any other type of photosensitive layer that includes metal. In such embodiments, references to oxygen/oxide can be replaced with references to other constituents, such as nitrogen/nitride, carbon/carbide, and/or other metal-comprising resist constituent. In such embodiments, the metal-comprising resist layers may or may not include oxygen. The advanced lithography processes, methods, and materials described above can be used in many applications, including FinFETs and/or GAA transistors. For example, fins may be patterned to produce a relatively close spacing between features, for which the above disclosure is well suited. In addition, spacers used in forming fins, also referred to as mandrels, can be processed according to the above disclosure.

An exemplary method includes forming a metal oxide resist layer over a workpiece by performing deposition processes to form metal oxide resist sublayers of the metal oxide resist layer over the workpiece and performing a densification process on at least one of the metal oxide resist sublayers. Each deposition process forms a respective one of the metal oxide resist sublayers. The densification process increases a density of the at least one of the metal oxide resist sublayers. Parameters of the deposition processes and/or parameters of the densification process can be tuned to achieve different density profiles, different density characteristics, and/or different absorption characteristics to optimize patterning of the metal oxide resist layer. In some embodiments, forming the metal oxide resist layer further includes performing a purge process after performing the densification process. In some embodiments, the deposition processes and the densification process are performed in a same process chamber. In some embodiments, performing the densification process includes exposing the at least one of the metal oxide resist sublayers to plasma. In some embodiments, performing the densification process includes soft baking the at least one of the metal oxide resist sublayers. In some embodiments, performing the densification process includes exposing the at least one of the metal oxide resist sublayers to ultraviolet (UV) radiation. In some embodiments, performing the densification process includes exposing the at least one of the metal oxide resist sublayers to infrared (IR) radiation. In some embodiments, the densification process is performed after each deposition cycle, such that each of the metal oxide resist sublayers is subjected to a respective densification treatment. In some embodiments, the method further includes tuning deposition parameters of the deposition processes, tuning densification parameters of the densification process, or both to achieve a gradient density in the metal oxide resist layer. In some embodiments, the method further includes performing an exposure process on the metal oxide resist layer and performing a development process on the metal oxide resist layer, thereby forming a patterned metal oxide resist layer over the workpiece.

Another exemplary method includes receiving a workpiece in a process chamber; performing, in the process chamber, at least two deposition processes to form a metal oxide resist layer over the workpiece; and performing, in the process chamber, a treatment process to modify a density profile of the metal oxide resist layer. In some embodiments, the treatment process is performed after each of the at least two deposition processes, such that the metal oxide resist layer has a uniform density from bottom to top. In some embodiments, the treatment process is performed after each of the at least two deposition processes, such that the metal oxide resist layer has a varying density from bottom to top. In some embodiments, the treatment process is performed after at least one of the at least two deposition processes, such that the metal oxide resist layer has a gradient density that increases from bottom to top. In some embodiments, the treatment process is performed after at least one of the at least two deposition processes, such that the metal oxide resist layer has a gradient density that decreases from bottom to top. In some embodiments, the treatment process is performed after at least one of the at least two deposition processes, such that the metal oxide resist layer has an alternating density.

An exemplary metal oxide resist layer includes a first metal oxide resist sublayer, a second metal oxide resist sublayer disposed over the first metal oxide resist sublayer, a third metal oxide resist sublayer disposed over the second metal oxide resist sublayer. The first metal oxide resist sublayer has a first density, the second metal oxide resist sublayer has a second density, and the third metal oxide resist sublayer has a third density. In some embodiments, the first density, the second density, and the third density are substantially the same. In some embodiments, the first density, the second density, and the third density are different. In some embodiments, the first density, the second density, and the third density are configured to provide the metal oxide resist layer with a gradient density from the first metal oxide resist sublayer to the third metal oxide resist sublayer.

Another exemplary method includes forming a metal oxide resist layer over a workpiece by performing a deposition process that includes more than one deposition cycle, such that the metal oxide resist layer includes a stack of metal oxide resist sublayers, and performing a densification process on at least one of the metal oxide resist sublayers, wherein the densification process increases a density of the at least one of the metal oxide resist sublayers. In some embodiments, the deposition process and the densification process are performed in a same process chamber. In some embodiments, performing the densification process includes exposing the at least one of the metal oxide resist sublayers to a plasma. In some embodiments, performing the densification process includes exposing the at least one of the metal oxide resist sublayers to an annealing process. In some embodiments, performing the densification process includes exposing the at least one of the metal oxide resist sublayers to ultraviolet (UV) radiation. In some embodiments, performing the densification process includes exposing the at least one of the metal oxide resist sublayers to infrared (IR) radiation. In some embodiments, the deposition process is a chemical vapor deposition process, an atomic layer deposition process, or a combination thereof. In some embodiments, the densification process is performed after each deposition cycle, such that each of the metal oxide resist sublayers of the stack of metal oxide resist sublayers is subjected to a respective densification treatment. In some embodiments, the method further includes tuning the performing of the deposition process, tuning the performing of the densification process, or both to achieve a gradient density in the metal oxide resist layer. In some embodiments, a first density of a topmost metal oxide resist sublayer of the stack of metal oxide resist sublayers is greater than a second density of a bottommost metal oxide resist sub-layer of the stack of metal oxide resist sublayers. In some embodiments, a first density of a topmost metal oxide resist sub-layer of the stack of metal oxide resist sublayers is less than a second density of a bottommost metal resist oxide sub-layer of the stack of metal oxide resist sublayers. In some embodiments, tuning the performing of the deposition process includes adjusting a precursor gas, a precursor gas flow, a deposition pressure, a deposition temperature, a deposition power, a deposition time, other deposition parameter, or a combination thereof. In some embodiments, tuning the performing of the densification process includes adjusting a treatment time, a treatment power, a treatment temperature, other treatment parameter, or a combination thereof. In some embodiments, the method further includes tuning the performing of the deposition process, tuning the performing of the densification process, or both to achieve an alternating density pattern in the stack of metal oxide resist sublayers. In some embodiments, the method further includes performing a purge process after the performing the densification process. In some embodiments, the densification process is a first densification process, and the method further includes performing a second densification process before the forming the metal oxide resist layer over the workpiece. In some embodiments, the method further includes performing an exposure process on the metal oxide resist layer and performing a development process on the metal oxide resist layer, thereby forming a patterned metal oxide resist layer over the workpiece. In some embodiments, the densification process is a first densification process, and the method further includes performing the exposure process includes exposing the metal oxide resist layer to patterned extreme ultraviolet (EUV) radiation. In some embodiments, the method further includes performing an etching process, an implantation process, or a deposition process on the workpiece using the patterned metal oxide resist layer as an etch mask, an implantation mask, or a deposition mask, respectively. In some embodiments, the method includes removing the patterned metal oxide resist layer after the etching process, the implantation process, or the deposition process. In some embodiments, the method further includes transferring a pattern in the patterned metal oxide resist layer to a sacrificial layer disposed over the workpiece, thereby forming a patterned sacrificial layer, and transferring a pattern in the patterned sacrificial layer to a material layer of the workpiece. In some embodiments, the method further includes performing a densification process on the workpiece before forming the metal oxide resist layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a metal oxide photoresist layer having a target thickness over a workpiece by:
        performing chemical vapor deposition processes to form metal oxide photoresist sublayers of the metal oxide photoresist layer over the workpiece, wherein each deposition process forms a respective one of the metal oxide photoresist sublayers having a respective thickness, wherein the respective thickness is less than the target thickness, and
        performing a densification process on at least one of the metal oxide photoresist sublayers, wherein the performing the densification process includes tuning parameters of the densification process to increase a density of the at least one of the metal oxide photoresist sublayers, wherein the densification process is separate from the chemical vapor deposition processes and the performing the densification process includes exposing the at least one of the metal oxide photoresist sublayers to plasma generated from at least a metal-containing precursor; and
    after performing the densification process and using the metal oxide photoresist layer to pattern an underlying layer of the workpiece, removing the metal oxide photoresist layer.

2. The method of claim 1, wherein the forming the metal oxide photoresist layer further includes performing a purge process after performing the densification process.

3. The method of claim 1, wherein the chemical vapor deposition processes and the densification process are performed in a same process chamber.

4. The method of claim 1, wherein the at least one of the metal oxide photoresist sublayers has an atomic structure that includes metal-and-oxygen constituents in a non-ordered arrangement after chemical vapor deposition and the densification process is configured to cause the metal-and-oxygen constituents to rearrange in an ordered arrangement.

5. The method of claim 1, wherein the performing the densification process includes soft baking.

6. The method of claim 1, wherein the performing the densification process includes an ultraviolet (UV) radiation treatment.

7. The method of claim 1, wherein the performing the densification process includes an infrared (IR) radiation treatment.

8. The method of claim 1, wherein the densification process is performed after each deposition cycle, such that each of the metal oxide photoresist sublayers is subjected to a respective densification process.

9. The method of claim 1, further comprising tuning the parameters of the densification process to achieve a gradient density in the metal oxide photoresist layer.

10. The method of claim 1, further comprising
    performing an exposure process on the metal oxide photoresist layer; and
    performing a development process on the metal oxide photoresist layer, thereby forming a patterned metal oxide photoresist layer over the workpiece.

11. A method comprising:
    receiving a workpiece in a process chamber;
    performing, in the process chamber, at least two deposition processes to form a metal oxide resist layer over the workpiece; and
    performing, in the process chamber, a plasma densification treatment process to modify a density profile of the metal oxide resist layer, wherein the plasma densification treatment process is separate from the at least two deposition processes and the plasma densification treatment process exposes the metal oxide resist layer to a plasma generated from at least a metal-containing precursor.

12. The method of claim 11, wherein the plasma densification treatment process is performed after each of the at least two deposition processes, and parameters of the plasma densification treatment process are tuned to provide the metal oxide resist layer with a uniform density from bottom to top.

13. The method of claim 11, wherein the plasma densification treatment process is performed after each of the at least two deposition processes, and parameters of the plasma densification treatment process are tuned to provide the metal oxide resist layer with a varying density from bottom to top.

14. The method of claim 11, wherein the plasma densification treatment process is performed after at least one of the at least two deposition processes, and parameters of the plasma densification treatment process are tuned to provide the metal oxide resist layer with a gradient density that increases from bottom to top.

15. The method of claim 11, wherein the plasma densification treatment process is performed after at least one of the at least two deposition processes, and parameters of the plasma densification treatment process are tuned to provide the metal oxide resist layer with a gradient density that decreases from bottom to top.

16. The method of claim 11, wherein the plasma densification treatment process is performed after at least one of the at least two deposition processes, and parameters of the plasma densification treatment process are tuned to provide the metal oxide resist layer with an alternating density.

17. A method comprising:
depositing a first metal oxide resist sublayer of a metal oxide resist layer over a workpiece, wherein the as-deposited first metal oxide resist sublayer has a first density;
depositing a second metal oxide resist sublayer of the metal oxide resist layer, wherein the as-deposited second metal oxide resist sublayer is deposited over the first metal oxide resist sublayer and the as-deposited second metal oxide resist sublayer has the first density;
depositing a third metal oxide resist sublayer of the metal oxide resist layer, wherein the third metal oxide resist sublayer is deposited over the second metal oxide resist sublayer and the as-deposited third metal oxide resist sublayer has the first density;
performing a densification treatment on at least the as-deposited second metal oxide resist sublayer before depositing the third metal oxide resist sublayer, wherein the as-deposited second metal oxide resist sublayer has a second density after the densification treatment that is different than the first density, and further wherein the metal oxide resist layer has a first density profile and the first density without performing the densification treatment, the metal oxide resist layer has a second density profile and includes the first density and the second density after performing the densification treatment, and the second density profile is different than the first density profile; and
after performing the densification treatment and using the metal oxide resist layer having the second density profile to pattern an underlying layer of the workpiece, removing the metal oxide resist layer from over the workpiece.

18. The method of claim 17, wherein the performing the densification treatment includes:
performing a first densification process on the as-deposited first metal oxide resist sublayer having the first density before depositing the second metal oxide resist sublayer, wherein first process parameters of the first densification process are tuned to change the first density of the as-deposited first metal oxide resist sublayer to a third density;
performing a second densification process on the as-deposited second metal oxide resist sublayer having the first density before depositing the third metal oxide resist sublayer, wherein second process parameters of the second densification process are tuned to change the first density of the as-deposited second metal oxide resist sublayer to the second density;
performing a third densification process on the as-deposited third metal oxide resist sublayer having the first density, wherein third process parameters of the third densification process are tuned to change the first density of the as-deposited third metal oxide resist sublayer to a fourth density; and
wherein the first process parameters, the second process parameters, and the third process parameters, respectively, of the first densification process, the second densification process, and the third densification process are tuned such that the second density, the third density, and the fourth density are substantially the same.

19. The method of claim 17, wherein the performing the densification treatment includes:
performing a first densification process on the as-deposited first metal oxide resist sublayer having the first density before depositing the second metal oxide resist sublayer, wherein first process parameters of the first densification process are tuned to change the first density of the as-deposited first metal oxide resist sublayer to a third density;
performing a second densification process on the as-deposited second metal oxide resist sublayer having the second density before depositing the third metal oxide resist sublayer, wherein second process parameters of the second densification process are tuned to change the first density of the as-deposited second metal oxide resist sublayer to the second density;
wherein a respective densification process is not performed on the as-deposited third metal oxide resist sublayer; and
wherein the first process parameters and the second process parameters, respectively, of the first densification process and the second densification process are tuned such that the third density is greater than the second density and the second density is greater than the first density.

20. The method of claim 17, wherein the performing the densification treatment includes:
performing a first densification process on the as-deposited second metal oxide resist sublayer having the first density before depositing the third metal oxide resist sublayer, wherein first process parameters of the first densification process are tuned to change the first density of the as-deposited second metal oxide resist sublayer to the second density;
performing a second densification process on the as-deposited third metal oxide resist sublayer having the first density, wherein second process parameters of the second densification process are tuned to change the first density of the as-deposited third metal oxide resist sublayer to a third density;
wherein a respective densification process is not performed on the as-deposited first metal oxide resist sublayer; and
wherein the first process parameters and the second process parameters, respectively, of the first densification process and the second densification process are tuned such that the second density is greater than the first density and the third density is greater than the second density.

21. The method of claim 17, wherein the densification treatment includes soft baking, an ultraviolet (UV) radiation treatment, an infrared (IR) radiation treatment, a plasma treatment that exposes at least the as-deposited second metal oxide resist sublayer to plasma generated from at least a metal-containing precursor, or a combination thereof.

* * * * *